United States Patent
Nair et al.

(10) Patent No.: US 8,890,376 B2
(45) Date of Patent: Nov. 18, 2014

(54) ENERGY HARVESTING METHODS AND DEVICES, AND APPLICATIONS THEREOF

(75) Inventors: Balakrishnan Nair, Sandy, UT (US); Andrew Joseph Gill, Salt Lake City, UT (US); Zachary Murphree, Salt Lake City, UT (US)

(73) Assignee: Oscilla Power, Inc., Salt Lake City, UT (US)

( * ) Notice: Subject to any disclaimer, the term of this patent is extended or adjusted under 35 U.S.C. 154(b) by 333 days.

(21) Appl. No.: 13/361,806

(22) Filed: Jan. 30, 2012

(65) Prior Publication Data
US 2013/0033130 A1 Feb. 7, 2013

Related U.S. Application Data

(60) Provisional application No. 61/437,586, filed on Jan. 28, 2011.

(51) Int. Cl.
*H01L 41/00* (2013.01)
*H02N 2/18* (2006.01)
*H01L 41/12* (2006.01)

(52) U.S. Cl.
CPC .......... *H02N 2/186* (2013.01); *Y02E 10/38* (2013.01); *H01L 41/125* (2013.01)
USPC .................................. 310/26; 310/306

(58) Field of Classification Search
USPC ................... 310/26, 306; 290/42, 53
See application file for complete search history.

(56) References Cited

U.S. PATENT DOCUMENTS

| | | | | |
|---|---|---|---|---|
| 4,539,485 A | * | 9/1985 | Neuenschwander | 290/53 |
| 2005/0099010 A1 | * | 5/2005 | Hirsch | 290/42 |
| 2005/0235641 A1 | * | 10/2005 | Sabol et al. | 60/497 |
| 2007/0040384 A1 | * | 2/2007 | Bernhoff et al. | 290/42 |
| 2007/0080539 A1 | * | 4/2007 | Kelly | 290/42 |
| 2007/0132246 A1 | * | 6/2007 | Hirsch | 290/42 |
| 2008/0088134 A1 | * | 4/2008 | Montgomery | 290/53 |
| 2008/0106101 A1 | * | 5/2008 | North et al. | 290/53 |
| 2010/0117366 A1 | * | 5/2010 | Rhinefrank et al. | 290/53 |
| 2012/0228875 A1 | * | 9/2012 | Hardin et al. | 290/52 |

* cited by examiner

*Primary Examiner* — Thanh Lam
(74) *Attorney, Agent, or Firm* — Jeffrey T. Holman

(57) ABSTRACT

An apparatus harvests electrical power from mechanical energy. The apparatus includes first and second load-bearing structures, a plurality of magnetostrictive elements, and an electrical circuit or coil. The load-bearing structures experience a force from an external source. The magnetostrictive elements are arranged between the load-bearing structures. The load-bearing structures transfer at least a portion of the force to at least one of the magnetostrictive elements. In this way, at least one of the magnetostrictive elements experiences the force transferred from the load-bearing structures. The force on the magnetostrictive element causes a change in magnetic flux of the magnetostrictive element. The electrical circuit or coil is disposed within a vicinity of the magnetostrictive element which experiences the force. The electrical circuit or coil generates electric power in response to the change in the magnetic flux of the magnetostrictive element.

20 Claims, 36 Drawing Sheets

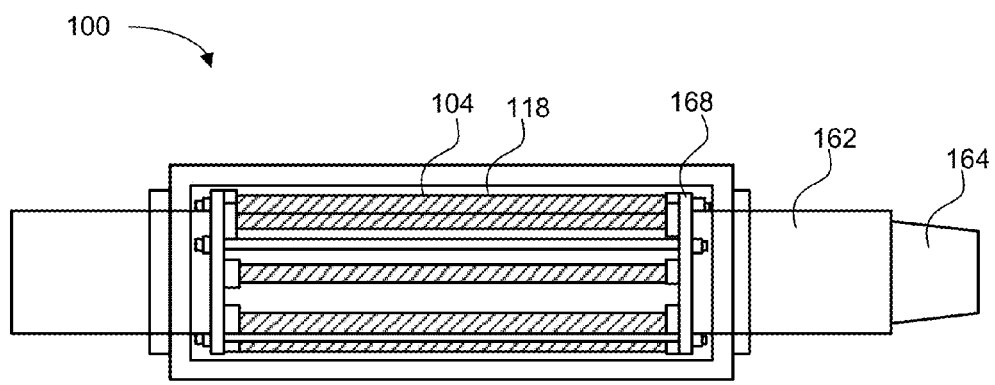
FIG. 1-4
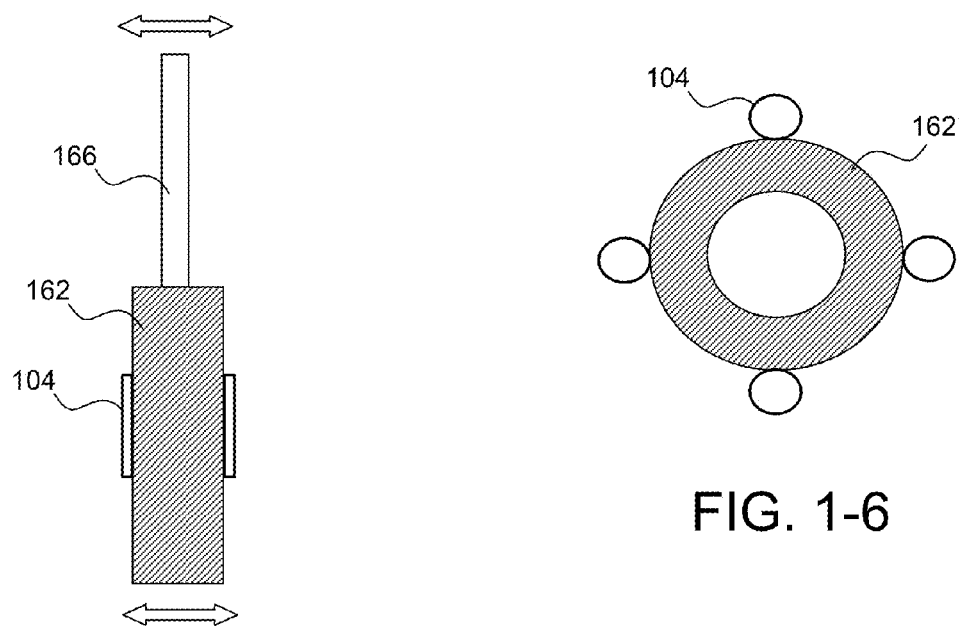
FIG. 1-5
FIG. 1-6

| drill collar | | | Magnetostrictive Rods | | |
|---|---|---|---|---|---|
| drill collar od | 0.229 | m | magnetostrictive diameter | 0.019 | m |
| drill collar id | 0.084 | m | cross sectional area | 2.85E-04 | m^2 |
| modulus elasticity | 200 | GPa | modulus elasticity | 165 | GPa |
| 2nd moment of area | 1.32E-04 | m^4 | number of rods | 8 | |
| collar length | 9 | m | 2nd moment area rods&collar | 1.32E-04 | m^4 |
| collar midpoint deflection | 0.01905 | m | | | |
| load at midpoint | 33.02 | kN | angle from bending plane | 0 | degrees |
| midpoint bending moment | 74297.50 | Nm | number of rods | 2 | |
| max collar stress | 64.52 | MPa | average stress | 69.89 | MPa |
| collar cross sectional area | 0.036 | m^2 | average force | 19.92 | kN |
| collar bending stiffness | 2.63E+07 | Nm^2 | 2nd moment area rods | 4.38E-06 | m^4 |
| | | | bending stiffness | 1.44E+06 | Nm^2 |
| | | | angle from bending plane | 45 | degrees |
| stiffness ratio msm to collar | 11.0% | | number of rods | 4 | |
| | | | average stress | 49.42 | MPa |
| | | | average force | 14.09 | kN |
| | | | 2nd moment area rods | 2.19E-06 | m^4 |
| | | | bending stiffness | 1.45E+06 | Nm^2 |
| | | | angle from bending plane | 90 | degrees |
| | | | number of rods | 2 | |
| | | | average stress | 0 | MPa |
| | | | average force | 0 | kN |
| | | | 2nd moment area rods | 6.46E-09 | m^4 |
| | | | bending stiffness | 2.13E+03 | Nm^2 |

FIG. 1-7

| Parameter | Value | Unit | Parameter | Value | Unit |
|---|---|---|---|---|---|
| Number of rods | 2 | | Number of rods | 4 | |
| Angle from bending plane | 0 | degrees | Angle from bending plane | 45 | degrees |
| Drillstring Frequency | 60 | Hz | Drillstring Frequency | 60 | Hz |
| Desired Load Change | 4200 | lbs | Desired Load Change | 2969.848 | lbs |
| Operating Temperature | 50 | C | Operating Temperature | 50 | C |
| Magnetostrictive Rod Dia | 0.75 | inches | Magnetostrictive Rod Dia | 0.75 | inches |
| Magnetostrictive Rod Area | 2.85E-04 | m2 | Magnetostrictive Rod Area | 2.85E-04 | m2 |
| Magnetostrictive Rod Length | 24 | inches | Magnetostrictive Rod Length | 24 | inches |
| Desired Stress Change | 65.6 | MPa | Desired Stress Change | 46.4 | MPa |
| Max Available Flux Density Change | 0.6 | Tesla | Max Available Flux Density Change | 0.6 | Tesla |
| Stress change for Max Flux Change | 60 | MPa | Stress change for Max Flux Change | 60 | MPa |
| Flux Density Change for desired stress change | 0.60 | Tesla | Flux Density Change for desired stress change | 0.46 | Tesla |
| Oscillation Period | 0.0167 | s | Oscillation Period | 0.0167 | s |
| Wire gauge | 10 | AWG | Wire gauge | 10 | AWG |
| Wire diameter | 0.10 | inches | Wire diameter | 0.10 | inches |
| Number of layers | 6 | | Number of layers | 6 | |
| Turns/rod | 235 | | Turns/rod | 235 | |
| Total Number of turns | 1410 | | Total Number of turns | 1410 | |
| Average coil dia | 1.36 | inches | Average coil dia | 1.36 | inches |
| Wire length | 153.27 | m | Wire length | 153.27 | m |
| Wire resistance | 0.55 | Ohms | Wire resistance | 0.55 | Ohms |
| Voltage | 57.87 | V | Voltage | 44.75 | V |
| Load Resistance | 15.00 | Ω | Load Resistance | 15.00 | Ω |
| Current | 3.7 | A | Current | 2.9 | A |
| Power | 307.713 | W | Power | 124.216 | W |
| Energy per oscillation | 6.923767634 | J | Energy per oscillation | 8.281098 | J |
| Total Power | 652.6506263 | | | | |

FIG. 1-8

| Alloy # | % Al | Tertiary | Max. Rel. ΔB | Max. Rel. dB/dσ | Resistivity x10⁻⁸ (Ω·m) | Corrosion Rate (g/m²·yr) |
|---|---|---|---|---|---|---|
| 1 | 20.0 | N/A | 0.948 | 0.845 | 5.48 | N/A |
| 2 | 19.0 | N/A | 0.992 | 0.734 | 5.53 | N/A |
| 3 | 18.5 | N/A | 1.000 | 0.850 | 5.84 | N/A |
| 4 | 18.0 | N/A | 0.983 | 1.000 | 4.63 | N/A |
| 5 | 17.5 | N/A | 0.887 | 0.845 | 4.58 | -115.5 |
| 6* | 16.5 | N/A | 0.718 | 0.685 | - | N/A |
| 7* | 12.5 | N/A | 0.700 | 0.658 | - | N/A |
| 8 | 19.0 | 0.8% C | 0.772 | 0.738 | 7.16 | N/A |
| 9 | 18.5 | 2.0% Mn | 0.941 | 0.875 | 6.45 | -180.0 |
| 10 | 18.5 | 8.0% Mn | 0.764 | 0.547 | 10.6 | -296.1 |
| 11 | 18.5 | 2.0% Mo | 0.808 | 0.673 | 6.99 | -148.8 |
| 12 | 18.5 | 8.0% Mo | 0.153 | 0.085 | 9.52 | 87.2 |
| 13 | 18.5 | 2.0% Co | - | - | - | -139.8 |
| 14 | 18.5 | 8.0% Co | - | - | - | N/A |
| 15* | 16.0 | 2.0% Co | 0.708 | 0.645 | - | N/A |

FIG. 2-5

| Magnetic Energy Change Estimates | | |
|---|---|---|
| Magnetostrictive Rod | | |
| Rod Diameter | 0.96 | inches |
| Rod Length | 6.25 | inches |
| Rod Area of Cross-Section | 4.67E-04 | m2 |
| Volume of Rod | 7.41E-05 | m3 |
| Relative Permeability | 300 | |
| Flux Density at Zero Stress | 1.7 | Tesla |
| Flux Density Under Load | 1.31 | Tesla |
| Magnetic Energy Density Change | 1557 | J/m3 |
| Magnetic Energy Change | 0.115 | J |
| | | |
| Flux Path (1018 Steel) | | |
| Width of Flux Path Links | 2 | inches |
| Thickness of Flux Path Links | 1 | inches |
| Length of Flux Path Links | 15 | inches |
| Area of Cross Section of Flux Path | 1.29E-03 | m2 |
| Volume of Flux Path Links | 4.92E-04 | m3 |
| Relative Permeability | 200 | |
| Flux Density at Zero Stress | 0.62 | Tesla |
| Flux Density Under Load | 0.47 | Telsa |
| Magnetic Energy Density Change | 306 | J/m3 |
| Magnetic Energy Change | 0.150 | J |
| Total Magnetic Energy Change | 0.266 | J |
| Total Strain Energy Change | 0.327 | J |
| | | |
| Mechanical to Magnetic Efficiency | 44.9% | |

| Elastic Energy Change Estimate | | |
|---|---|---|
| | | |
| Elastic Modulus | 165 | GPa |
| Stress | 38.1 | MPa |
| Elastic Energy Density Change | 4409 | J/m3 |
| Elastic Energy Change | 0.327 | J |

FIG. 2-8

| Design Variables (User Input) | | |
|---|---|---|
| Max Power | 300 | MW |
| Ocean depth | 75 | m |
| Number of Buoys | 30 | |
| Buoy Diameter | 25.0 | m |
| Buoy Density | 25.0 | kg/m3 |
| Buoy Height | 9 | m |
| Canister Wall Thickness | 0.25 | cm |
| Anchor Height | 3 | m |
| Elements/tether | 32 | |
| Max Flux Change ($\Delta B$) | 1.2 | T |
| Magnetic to Electrical Efficiency | 95% | |
| Mechanical to Magnetic Efficiency | 40% | |
| Aluminum Wire Guage | -3 | AWG |
| Number of layers of coil | 9 | |
| Individual Element Length | 1.5 | m |
| Element Diameter | 10 | cm |
| Flux path Length/Element Length | 1.2 | |
| Tethers | 3 | per buoy |
| Chain breaking load safety factor based on MHK | 200% | |
| Chain breaking load safety factor based on buoyanc | 200% | |
| Canister Height Multiplier | 1.20 | |
| Canister Dia Multiplier | 2.50 | |
| Precompression | 840 | MPa |
| Load resistance multiplier | 1 | |
| Availability | 0.95 | |
| Marine-ization Factor - Electronics | 2 | x |
| Marine-ization Factor - LRC, O&M | 2 | x |
| Capex Contingency | 10% | |
| Fixed Charge Rate | 0.12 | |
| Vessel Days/Buoy | 1 | |
| Vessel Day Rate | $ 50,000 | $/day |
| Installation Cost / Transportation Cost | 100% | |
| OPI margin on core components | 33% | |
| OPI margin on other cost elements | 15% | |

FIG. 2-15a

| Array Parameters (Calculated) | | |
|---|---:|---|
| Max Voltage/Buoy | 91,969 | V |
| Rated Power | 17,321 | kW |
| Avg. Power @ 100% Availability | 11,335 | kW |
| Average Power | 10,768 | kW |
| Annual Electricity Production | 89,675 | MWh |
| Average LCOE $ | 0.099 | /kWh |

| Array Price Details | | |
|---|---:|---:|
| Cost Elements | USD '000s | % of ICC |
| Electromagnetic components | 17,756 | 32% |
| Anchor & Mooring | 18,023 | 32% |
| Buoy + Canister Packaging | 2,776 | 5% |
| Core Components | 38,555 | 69% |
| Power Electronics | 6,287 | 11% |
| Other Hardware | 1,520 | 3% |
| Non-Core Components | 7,807 | 14% |
| Transportation & Installation | 3,529 | 6% |
| Permits | 588 | 1% |
| Engineering | 5,609 | 10% |
| Non-Core Services | 9,726 | 17% |
| Subtotal | 56,088 | |
| Contingency | 5,609 | |
| Total Installed Capital Cost | 61,697 | |
| LRC + O&M + Leasing - annual costs | 1,458 | |

FIG. 2-15b

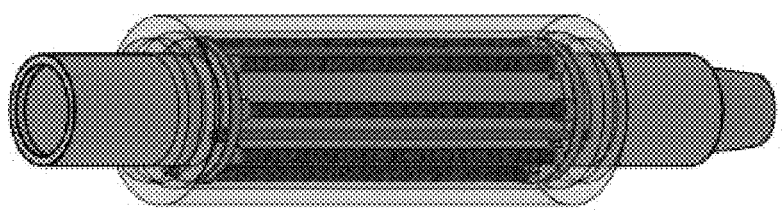
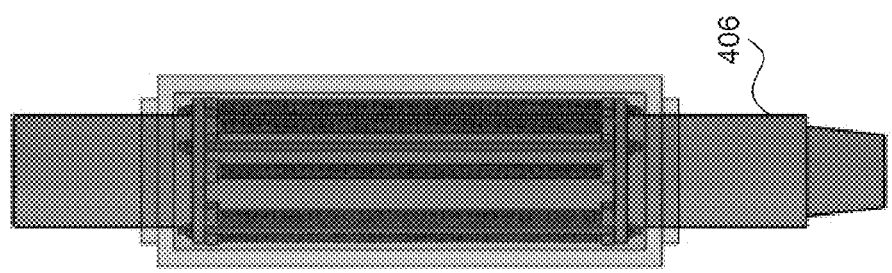
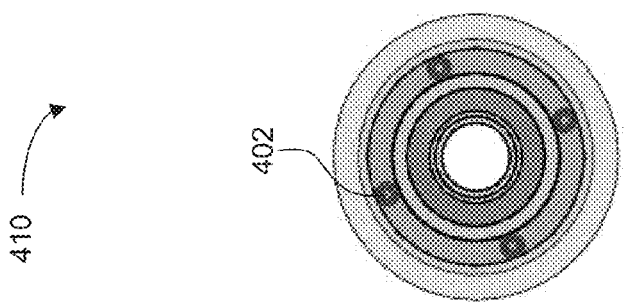
FIG. 4-2

US 8,890,376 B2

ENERGY HARVESTING METHODS AND DEVICES, AND APPLICATIONS THEREOF

CROSS-REFERENCE TO RELATED APPLICATIONS

This application claims the benefit of U.S. Provisional Application No. 61/437,586, filed Jan. 28, 2011, and entitled "Energy Harvesting Methods and Devices, and Applications thereof," which is incorporated by reference herein in its entirety.

STATEMENT OF FEDERALLY SPONSORED RESEARCH

This invention was made in part with Government support under Grant No: IIP-1014346 awarded by the National Science Foundation (NSF) and Contract No: WC133R-10-CN-0220 from the National Oceanographic and Atmospheric Administration (NOAA). The Government has certain rights to this invention.

SUMMARY

Embodiments of an apparatus are also described. In one embodiment, the apparatus harvests electrical power from mechanical energy. The apparatus includes first and second load-bearing structures, a plurality of magnetostrictive elements, and an electrical circuit or coil. The load-bearing structures experience a force from an external source. The magnetostrictive elements are arranged between the load-bearing structures. The load-bearing structures transfer at least a portion of the force to at least one of the magnetostrictive elements. In this way, at least one of the magnetostrictive elements experiences the force transferred from the load-bearing structures. The force on the magnetostrictive element causes a change in magnetic flux of the magnetostrictive element. The electrical circuit or coil is disposed within a vicinity of the magnetostrictive element which experiences the force. The electrical circuit or coil generates electric power in response to the change in the magnetic flux of the magnetostrictive element.

In another embodiment, the apparatus includes an attachment structure, a magnetostrictive element, and an electrical circuit or coil. The attachment structure attaches the apparatus to a wall of an elongated structure that experiences vibrations. The magnetostrictive element is coupled to the attachment structure. The magnetostrictive element experiences a force in response to the vibrations experienced by the elongated structure and further experiences a change in magnetic flux in response to the force. The electrical circuit or coil is disposed within a vicinity of the magnetostrictive element. The electrical circuit or coil generates electric power in response to the change in the magnetic flux of the magnetostrictive element. Other embodiments of the apparatus are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

FIG. 1-2 illustrates another embodiment of an energy generating device for use in a downhole drilling application.

FIG. 1-3 illustrates another embodiment of an energy generating device for use in a downhole drilling application.

FIGS. 1-4, 1-5, and 1-6 illustrate other embodiments of an energy generating device that converts the movement of the drill string into electrical energy. In particular, FIGS. 1-4 and 1-5 illustrate side views, and FIG. 1-6 illustrates a cross-sectional or end view.

FIGS. 1-7 and 1-8 illustrates tables with calculations related to an embodiment of a lateral bending vibration energy harvester.

FIG. 1-9 illustrates a cross-sectional or end view of another embodiment of an energy generating device for converting lateral bending vibration energy into electrical energy.

FIG. 2-1 illustrates one embodiment of a wave energy harvesting device based on the principle of reverse magnetostriction.

FIG. 2-2 illustrates one embodiment of tether systems to secure magnetostrictive elements to buoys.

FIG. 2-3 illustrates another embodiment of tether systems to secure magnetostrictive elements to buoys.

FIG. 2-4 illustrates another embodiment of tether systems using multiple groups of parallel tethers extending from the buoys.

FIG. 2-5 illustrates a table of alloy compositions and magneto-mechanical/electrical properties for measurements of corresponding alloy flux density, as well as the maximum change in flux density for each alloy composition.

FIG. 2-6 illustrates one embodiment of a hydraulic loading system to compress a magnetostrictive element.

FIG. 2-7 illustrates a graph of one embodiment of test results for the change in magnetic flux density for a change in applied load.

FIG. 2-8 illustrates a table of a sample calculation of the elastic energy, magnetic energy and estimated mechanical to magnetic energy conversion efficiency for an embodiment of an energy harvesting device.

FIG. 2-9 illustrates before and after images of four corrosion coupons before and after 21 day ocean water exposure.

FIG. 2-10 illustrates one embodiment of power take-off (PTO) module for magnetostrictive performance testing.

FIG. 2-11a illustrates a graph of wave-tank measurements of load and voltage, as well as voltage calculated from measured load.

FIG. 2-11b illustrates a graph of a correlation between measured and calculated data.

FIG. 2-12 illustrates a graph of single-sided amplitude spectra of wave height and tether tension.

FIG. 2-13 illustrates one embodiment of a spar buoy, tethers, and PTO modules (located serially within the tether lengths) modeled in OrcaFlex.

FIG. 2-14a illustrates a graph of tether tensions of nine tethers connected to a 6 m draft buoy under a wave condition with 5.2 m wave height and 5.6 s period.

FIG. 2-14b illustrates a graph of a correlation of tether tension between the top and bottom of the tether.

FIGS. 2-15a and 2-15b illustrate a cost model based on results from hydrodynamic testing.

FIG. 3-1 illustrates three embodiments of flux path configurations with (a) one, (b) two, and (c) three flux paths.

FIG. 3-2 illustrates a graph of magnet thickness effects for the arrangement of FIG. 3-1 having two flux paths.

FIG. 3-3 illustrates a graph of an effect of magnet cross-section for the two flux-path case from FIG. 3-1.

FIG. 3-4 illustrates a graph of an effect of number of flux paths for 2"×1"×0.125" magnet.

FIG. 3-5 illustrates a graph of a demonstration of 1 Tesla flux change using commodity Fe—Al alloys.

FIG. 3-6 illustrates a graph of a maximum change in flux density per strain cycle vs. number of flux paths for 2"×0.5"×0.0625" magnets.

FIG. 3-7 illustrates a graph of flux density change per strain cycle vs. applied load for varying flux path materials.

FIG. 3-8 illustrates a test embodiment which includes a magnetic circuit with an unloaded Fe—Al rod as flux path component.

FIG. 3-9 illustrates a graph of test results for voltage output of a coil on magnetostrictive and flux path elements with load applied only to one elements.

FIG. 3-10 illustrates a graph of test results for voltage output of a coil on magnetostrictive and flux path elements with load applied both elements.

FIG. 3-11 depicts an image of one embodiment of the sub-scale compression fixture design of FIG. 2-10.

FIG. 3-12 illustrates a graph of predicted and measured results of bench testing of the compression fixture of FIG. 3-11.

FIG. 3-13 illustrates a schematic circuit diagram to show how the magnets, flux path components and magnetic components are treated in the magnetic circuit.

FIG. 3-14 illustrates a graph of one set of measured data for the change in permeability with stress of the magnetic circuit of FIG. 3-13.

FIG. 3-15 illustrates a graph of a change in flux density with stress for flux paths with 2"×0.5"×0.0625" magnets predicted by magnetic circuit based modeling.

FIG. 3-16 illustrates a graph of a change in flux density with stress for flux paths with 2"×1"×0.0625" magnets predicted by magnetic circuit based modeling.

FIG. 4-1 shows an embodiment of a device with a moving mass and springs that may be used for harvesting energy from vibrations of machinery.

FIG. 4-2 shows an embodiment of a device with one or more magnetostrictive elements that may be used for harvesting energy from vibrations of machinery.

Throughout the description, similar reference numbers may be used to identify similar elements.

DETAILED DESCRIPTION

Figure 1:
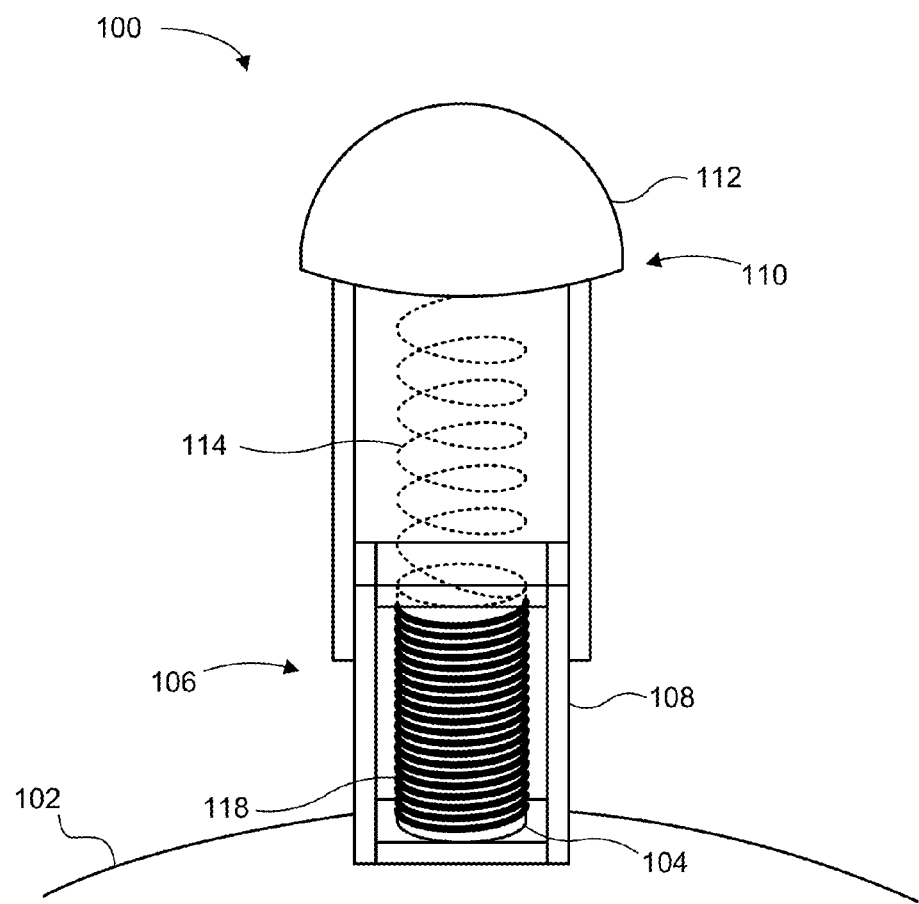
FIG. 1-1 illustrates one embodiment of an energy generating device for use in a downhole drilling application.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Embodiments described herein include a method and device for harvesting energy or generating electricity. In one embodiment, the device includes at least one magnetostrictive element and one or more electrically conductive coils or circuits. The device also includes one or more magnetic circuits which are coupled with one or more electrical circuits to increase or maximize power production. When the magnetostrictive element is deployed in a body of water, the motion of and/or the hydrodynamic forces applied by the body of water, including wave motion, acting on a component mechanically coupled to a structure comprising the magnetostrictive element, causes changes in the stress and/or strain of the magnetostrictive element. Alternatively, the magnetostrictive element may be deployed in a different fluid. The electrically conductive coil or circuit is within the vicinity of the magnetostrictive element. A corresponding change in magnetic flux density passing through the magnetostrictive element as magnetic permeability of the magnetostrictive element changes with stress, generates an electric voltage and/or electric current in the electrically conductive coil or circuit.

The embodiments include a device for generating electricity, the device at least one magnetostrictive element and one or more electrically conductive coils or circuits. The magnetostrictive element, when deployed as a part of a structure in a body of water, the motion of the body of water, including wave motion, or hydrodynamic interaction of waves with a component mechanically coupled with the structure comprising the magnetostrictive element, causes changes in the strain of one or more magnetostrictive elements. The one or more electrically conductive coils or circuits are within the vicinity of one or more of the magnetostrictive elements. A corresponding change in magnetic flux density in the one or more magnetostrictive elements generates an induced electric voltage and/or electric current in the one or more electrically conductive coils or circuits. In some embodiments, there is no substantial relative motion between the one or more magnetostrictive elements and the one or more electrically conductive coils or circuits.

Other embodiments include a device where the magnetic flux is directed through one or more magnetostrictive elements by one or more "flux paths" composed of, in addition to the one or more magnetostrictive elements themselves, a combination of magnetically permeable material and one or more permanent magnets. Permeable materials include magnetostrictive materials. In other embodiments, the magnetostrictive element includes a magnetostrictive core, which may be part of the flux path. The magnetostrictive core, permeable materials, and the permanent magnets may experience changes in stress, experience at least part of the applied load on a structure comprising the flux path, (e.g., a tether), and/or share other functions with the magnetostrictive element. In some embodiments, the applied load on a structure comprising the flux path is substantially shared between one or more magnetostrictive elements, and brittle components such as the permanent magnets will not experience any changes in load/stress.

Other embodiments of the device include at least one electrically conductive coil or circuit that is in the vicinity of the flux paths and/or magnetostrictive material. The electrically conductive coil or circuit may include, or be substantially made of, an electrically conductive material such as copper or aluminum, which may have an insulating coating on the wire.

An embodiment may include a fixture for applying a pre-stress load, either compressive or tensile, to the magnetostrictive element. The fixture may be made of magnetically permeable and/or impermeable material and may include flux paths and permanent magnets, or electromagnets. In one embodiment, a bias magnetic field is also applied to one or more materials described in this disclosure. The fixture may include design considerations that reduce the occurrence of magnetic saturation and overall magnetic reluctance of the device. The fixture is also designed to transfer applied external loads to the magnetostrictive element to cause a change in magnetic properties of the element. The design of the fixture may seek to increase or maximize the amount of load transferred to the magnetostrictive element. The method for applying the pre-stress may be through the use of bolts, or other means to make a rigid connection to the magnetostrictive element, which may or may not have low magnetic permeability to reduce magnetic flux leakage. The fixture for applying the pre-stress load may include bolts. The bolt material may also be chosen to have a low Young's modulus and high yield strength. The bolt diameter may be chosen to decrease the stiffness of the bolts relative to that of the magnetostrictive element(s). The fixture may also include aluminum brackets (or brackets of another material) for locating the permanent magnets. The fixture may include two or more flat bars (or structural plates) of metal with holes drilled in them for threaded rods and nuts. The flat bars may or may not be made of a magnetically permeable alloy such as mild steel, or a relatively impermeable alloy such as stainless steel. The use of magnetically permeable flat bars may include additional bars to create a closed flux path.

An embodiment of the device may include one or more magnetostrictive elements that are a binary alloy of iron and aluminum, with an atomic percentage of aluminum between about 14 and 21%. Another embodiment of the device may include one or more magnetostrictive elements that are a binary alloy of iron and aluminum, with an atomic percentage of aluminum between about 18% and 19%. The elements may also be a ternary alloy of iron and aluminum with the third component being either manganese, cobalt, molybdenum, or tungsten with an atomic percentage between about 1% and 10%. Either the binary or ternary composition may include trace additives to improve mechanical properties such as ductility and machinability. Trace additives that serve this role include, but are not limited to: niobium, titanium, vanadium, boron, carbon, or any other element demonstrated to reduce grain growth or grain boundary fracture. In other embodiments, the magnetostrictive element includes different materials from those named, above. In other embodiments, the magnetostrictive element includes a combination of materials from those named above and other materials.

Embodiments of the device may include an external enclosure to protect the device from the effects of the external environment, e.g. salt-water corrosion or other corrosive fluids. The external enclosure may include components designed as seals and gaskets, and may include a structural element for transferring the load to the internal compression fixture and magnetostrictive element. These components may include deformable seals or constituent parts. The enclosure may also have leak-tight electrical connections to connect internal and external electrical systems. The enclosure may also include structural elements for attaching the device to one or more tethers and/or buoys and/or other devices. In other embodiments, the enclosure may include other materials or other structures.

While examples of ocean applications are provided above for the magnetostrictive devices, at least some of the embodiments described can be used in drilling applications. The drilling applications may include downhole drilling applications. Some embodiments are suitable for downhole drilling applications, including but not limited to oil and gas applications or for geothermal applications.

Embodiments described herein include a method and device for converting the mechanical energy from vibration and impact loads that are generated during a drilling operation into magnetic and electrical energy using a novel design that utilizes magnetostrictive elements. Such devices may be useful in powering a variety of different types of equipment that may be located on the drill string and/or the bottom hole assembly (BHA). These include, but are not limited to measurement while drilling (MWD) tools, logging while drilling (LWD) tools, sensors, transmitters, receivers, repeaters etc. Embodiments of the design combine proven concepts from existing technologies with technology proven on the bench scale for energy generation using magnetostrictive devices to create a powerful solution for harvesting energy from drilling operations. Embodiments include designs that can convert the energy from axial, lateral or torsional vibrations to electrical energy. Some embodiments may help to reduce usage of or eliminate use of batteries downhole. Embodiments of the design are expected to have relatively low capital costs and very good survivability during downhole drilling operations. Some embodiments may include power management strategies to optimize the delivered power from a suite of devices distributed across the length of the drill string and/or BHA. Some embodiments will include components for applying a pre-stress to the magnetostrictive elements, or other materials described in embodiments, herein, which may be either tensile or compressive. Other embodiments will convert the mechanical energy from vibration and impact loads from other mechanical energy besides the mechanical energy generated from drilling operation. Other embodiments will convert hydrodynamic energy in combination with, or replacement of, the mechanical energy generated from vibration and impact loads.

Vibration Energy Harvesting Applications

FIG. 1-1 illustrates one embodiment of an energy generating device 100 for use in a downhole drilling application. In this embodiment the energy generating device 100 is mounted on the outer surface of a pipe 102 that is part of the drill string (not shown). Attached to the surface of the pipe 102 in a radial direction is a magnetostrictive alloy rod 104 that is contained within a "cage" 106. The cage 106 consists of magnetically permeable material 104 and bias magnets 108. The cage 106 serves to create a closed path flux loop that includes the magnetostrictive alloy rod 104. On the top surface of the magnetostrictive alloy rod 104 and flux cage 106 is a mechanism 110 for generating load changes on the magnetostrictive alloy rod 104. This loading mechanism 110 includes an impact head 112 that makes contact with the rock wall (not shown) in the drill hole and a compression spring 114. As the distance between the central drill pipe 102 and the rock wall changes, the force being applied to the compression spring 114 changes. When the magnetostrictive alloy rod 104 experiences a load change generated by the compression spring 114 and impact head 112, there is a corresponding change in magnetic permeability in the magnetostrictive material 104. This results in a change in magnetic flux density passing through the magnetostrictive material 104 as the load from the compression spring 114 changes. This change in magnetic flux causes electrical energy to be generated in the coil 118 that surrounds the magnetostrictive alloy rod 104.

The size and spring constant of the compression spring 114, along with the diameter of the magnetostrictive alloy material 104 can all be adjusted to create a design that is suitable for a given drilling operation and/or power requirement. In addition, the number of energy generating devices 100 installed at a particular location, or along a particular drill string, can be varied to produce different power levels. FIG. 1-1 shows a single energy generating device 100. However, multiple energy generating devices 100 can be spaced along the length and/or circumference of the central drill pipe 102 to generate more power than a single energy generating device 100 can generate. The spacing of the energy generating devices 100 along the drill pipe 102 can be done in such a way as to not impede the return flow of the drilling mud that typically flows back up the annular hole between the outside surface of the drill pipe 102 and inside surface of the rock drill hole (i.e., the space in which the energy generating device 100 is installed).

Figures 1, 2:
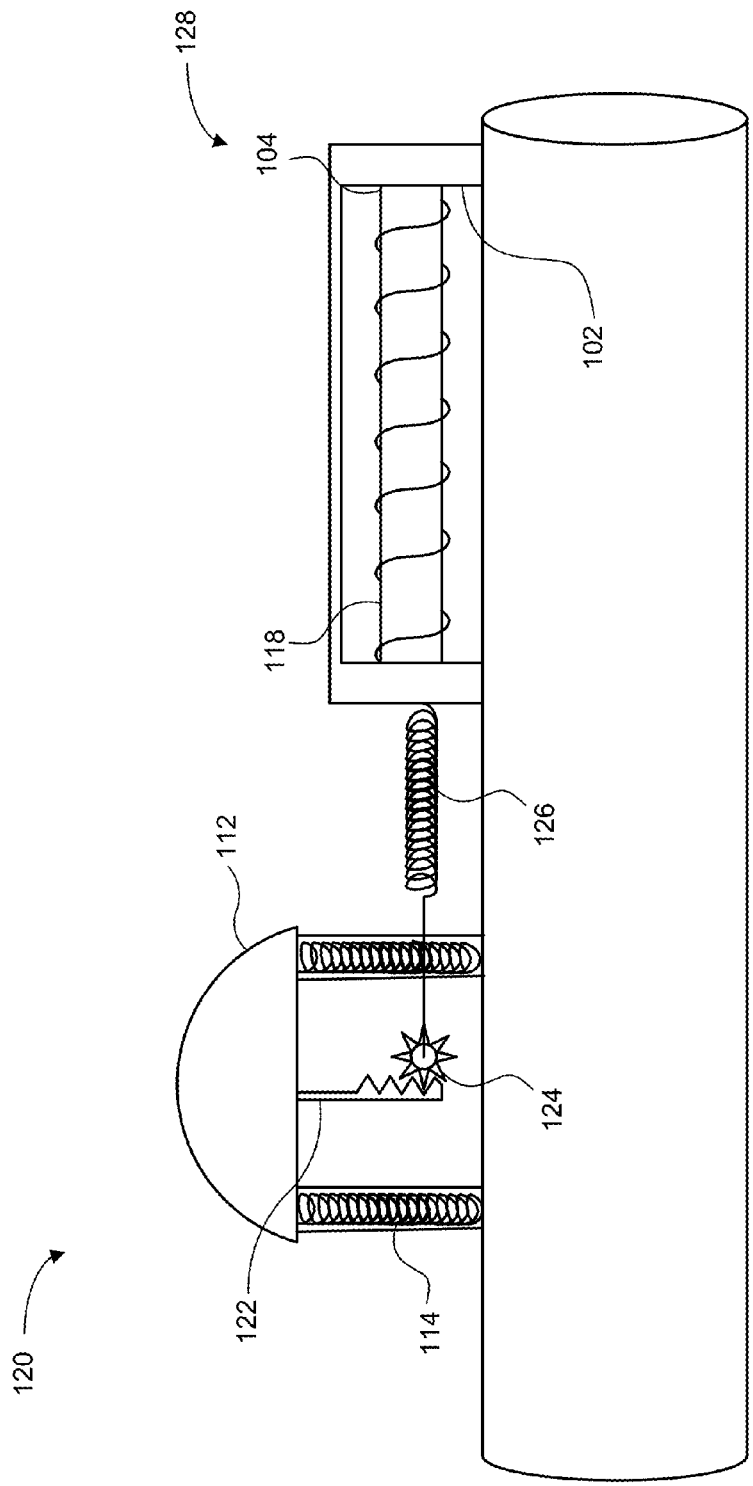

FIG. 1-2 illustrates another embodiment of an energy generating device 120 for use in a downhole drilling application. In this example, a similar "shock absorber" type mechanism is used to capture the mechanical energy from impact loads from collisions with the rock wall during drilling. However, in this case, the impact force load from contacting the rock wall is used to drive a piston rod 122 in an oscillating linear motion. Then, a gear system or lever arm 124 is used to transfer this oscillating motion into the tensioning of a high tension spring 126. The oscillating motion of the piston rod 122 results in changes in the tensioning force being applied to the magnetostrictive rod assembly 128. The changes in tensile force being applied to the magnetostrictive alloy rod 104 result in the generation of electrical power in the coil 118 that surrounds the magnetostrictive alloy rod 104. One potential advantage to this embodiment is that it allows for using a longer magnetostrictive rod 104 that may be useful for generating higher power levels for some applications. In both of these embodiments described, where an impact head 112 is contacting the surface of the rock wall, some embodiments may include bearings or roller bearings (not shown) in the surface of the impact head 112 where it makes contact with the rock wall so that the frictional losses will be reduced or minimized and, therefore, have less influence on the drilling operation.

Figures 1, 2, 3:
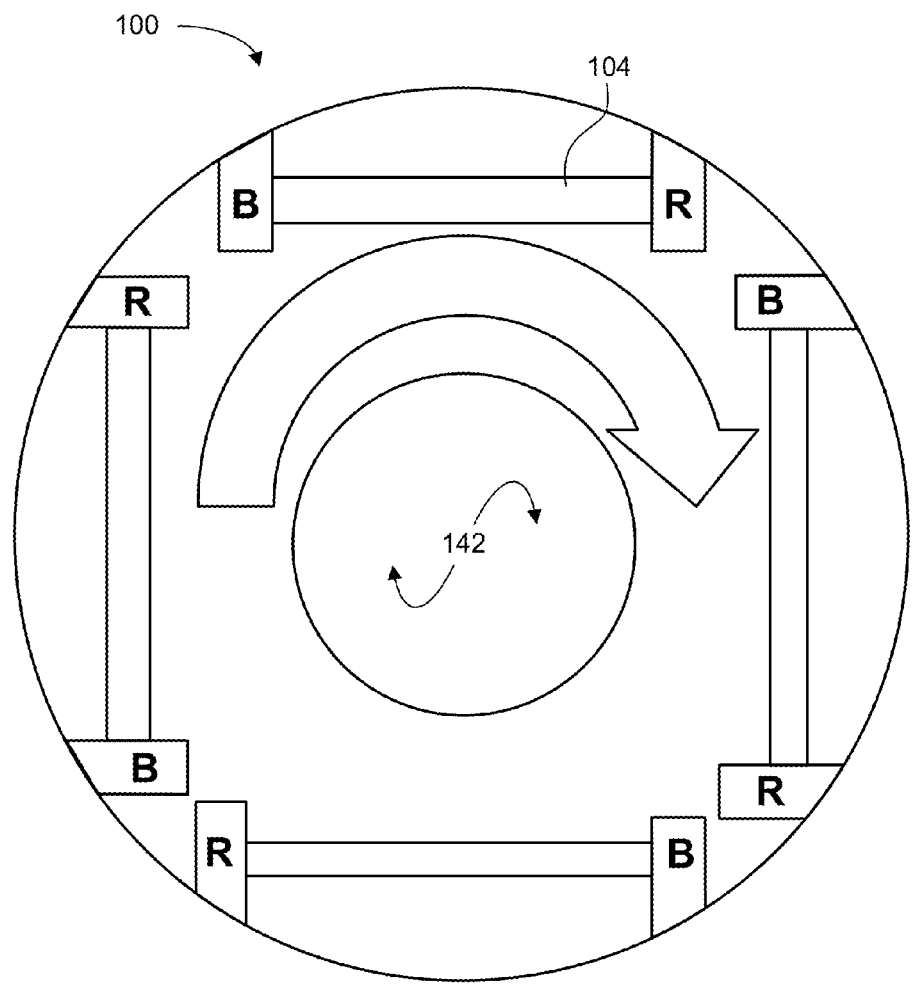

FIG. 1-3 illustrates another embodiment of an energy generating device 140. The illustrated energy generating device 140 utilizes the energy contained in the torsional modes of vibration, i.e. "stick-slip." Looking axially down the drillstring, the energy generating device 140 has magnetostrictive elements 104 in a tangential direction, as indicated by the cross-hatched elements. As the string rotates clockwise, the blue ("B") brackets, which are connected to the upper part of the drill-string (towards the top of the well), will transfer the torque to the red ("R") brackets, which are connected to the lower part of the drill string (towards the bottom of the well), by axially loading the magnetostrictive rod 104. The stick-slip will cause large changes in the axial loads of the magnetostrictive rod 104, which are then converted into magnetic energy through magnetostriction and subsequently electrical energy through induction. The energy generating device 140 may include any number of magnetostrictive elements 104 at a single axial location along the drill string, and any number of groups of magnetostrictive elements 104 along the axial dimension (i.e., length) of the drill string. In one embodiment, the energy generating device 140 has a central hole 142 through which drilling mud may flow.

FIGS. 1-4, 1-5, and 1-6 illustrate another embodiment of an energy generating device 160 that converts the bending in the drill string 162 due to lateral vibrational loads into electrical energy. As the drill head 164 is penetrating the rock, the drill string 162 experiences vibrations in lateral, axial, and torsional directions. The lateral vibrations impose bending loads along the length of the drill string 162. In this embodiment, the energy generating device 160 has magnetostrictive material 104 around the circumference of the drill collar 166 or other external surface along the length of the drill string 162. Different angular positions along the circumference of the drill collar 166 will capture the loading along different lateral directions. The changes in load experienced by the drill collar 166 will also be experienced by the magnetostrictive material 104 which will result in changes in magnetic flux through reverse magnetostriction. The changes in magnetic flux are then converted to electrical energy through induction in a coil 118 surrounding the magnetostrictive material 104. The magnetostrictive material 104 may be in the vicinity of bias magnets (not shown) and flux paths to increase or maximize the changes in flux due to the changing stress state in the magnetostrictive material 104. The magnetostrictive material 104 may be in a state of pre-stress that is caused by a pre-stress fixture 168, such as a compression fixture. The standard geometry of the drill collar 166 may be used, allowing mud to flow through the center. The outer envelope of the magnetostrictive material 104 will be sufficiently smaller than the bore-hole diameter to allow mud to adequately flow out of the hole.

For reference, some calculations of bending stresses in magnetostrictive materials mounted to drill collar are provided below. These calculations assume a simple supported beam with a point load applied at the midpoint. The beam has length L, the point load P is applied at x=L/2. The reaction forces at the ends of the beam are R=P/2 and act in the opposite direction of P. The bending moment equations for the beam are:

$$0<=x<=L/2 : M(x)=(P/2)*x$$

$$L/2<=x<=L : M(x)=(P/2)*(L-x)$$

The second derivative of deflection with respect to x is related to the moment equation as follows:

$$v''=M(x)/(E*I) \quad E\text{---modulus of elasticity, I---second moment of area}$$

Integrating twice and solving for the constants of integration, the deflection equation for the beam is derived as:

$$0<=x<=L/2 : v(x)=1/(E*I)*[(P*x^3)/12-(P*L^2*x)/16]$$

$$L/2<=x<=L : v(x)=1/(E*I)*[(P*x^3)/12-(P*(x-L/2)^3)/6-(P*L^2*x)/16]$$

The maximum deflection and bending moment occurs at x=L/2:

$$v(L/2)=(P*L^3)/(48*E*I)$$

$$M(L/2)=(P*L)/4$$

The drill collar has a tubular cross section with outer diameter D and inner diameter d. Given a deflection at x=L/2, the load P can be calculated as can the moment M(L/2).

A cylindrical magnetostrictive rod of diameter dm is attached at the top and bottom of the drill collar. Assume the same loading conditions are present and that the magnetostrictive rods have negligible effect on the bending moment equation. It is possible to calculate the bending stresses which occur at the center of the magnetostrictive rods.

$$\sigma=(M(L/2)*c)/I$$

c—distance from the neutral axis to the center of the magnetostrictive rod $$c=D/2+dm/2$$

I—second moment of area of the drill collar and magnetostrictive rods $$I=(\pi/64)*(D^4-d^4)+2*[(\pi/4)*dm^4+(n/4)*dm^2*(D/2+dm/2)^2]$$

FIGS. 1-7 and 1-8 illustrates tables with calculations of the bending stress and power production capability of the lateral bending vibration harvester. The configuration is as stated above, with 8 rods spaced equidistant around the circumference of the drill pipe, as shown in FIG. 1-9. This means that two are located at zero degrees relative to the bending plane, are 45° out of plane, and two are 90° out of plane (which don't contribute significantly to the stiffness or power generation).

Ocean Energy Harvesting Applications

Portions of this section describe activities demonstrating aspects of the technical and economic viability of a magnetostrictive wave energy harvester (MWEH). Some embodiments herein utilize magnetostrictive alloy compositions with appropriate magneto-mechanical properties that enable low-cost energy production from ocean waves. Wave-tank testing of a sub-scale device and hydrodynamic modeling of the system can be used to more accurately predict power generation capacity and durability. In some embodiments, new materials compositions are used to provide a 40% improvement in magnetic flux density obtainable relative to conventional materials. While tertiary alloy additions do not necessarily enhance corrosion resistance of the magnetostrictive alloys significantly, alloy corrosion through direct seawater exposure is not a significant concern because at least one embodiment of a no-moving-parts system is able to use highly reliable sealing techniques routinely used in the marine environment. The hydrodynamic modeling indicates that embodiments of the system can result in relatively stable and consistent operation in the ocean environment while generating electric power at a cost of under $0.10/kwh when used at utility-scale. Finally, wave tank testing demonstrates a high correlation between test results and results obtained from predictive models.

FIG. 2-1 illustrates one embodiment of a wave energy harvesting device 200 based on the principle of reverse magnetostriction. A stress or strain imposed on a magnetostrictive material 202 causes its magnetic properties (e.g., magnetic permeability) to change significantly. In one embodiment, the magnetic property is a magnetic flux density of a magnetostrictive component 202. In the presence of a bias magnetic field, a closed-loop magnetic circuit can be designed in which changes in load on the magnetostrictive material result in changes in magnetic flux density. The hydrodynamic loads caused by the wave/buoy interaction result in corresponding load changes in the magnetostrictive alloy rods 202 which are embedded in the taut tethers 204 connecting the buoy 206 to its anchor 208; these in turn result in a constantly changing magnetic flux through the rods 202 with only minimal elastic deformation (100's of ppm) of the alloy rods 202. If coils 210 are wrapped around (or otherwise deployed around) any part of the magnetic circuit, a voltage will be induced in the coils 210 according to Faraday's law of induction. This principle allows construction of a wave energy harvesting device 200 with no moving parts. The use of low-cost commodity metals as the magnetostrictive alloy constituents can lead to energy costs that are competitive with conventional power sources. In some embodiments, the magnetostrictive rod 202 is mounted in a compression device 212, and the magnetostrictive rod 202 and the electrical coil 210 are enveloped in a protective casing 214. In some embodiments, at least a portion of the compression device 212 provides a flux path 216 within the wave energy harvesting device.

The buoys 206 may be designed to have a draft sufficient to provide stability and large buoyant forces. The buoy 206 may have connections for one or more tethers 204 that extend from the buoy 206 to the anchor 208 at the ocean floor. The tethers 204 may extend from the buoy 206 in one or more radial directions and at one or more inclination angles relative to the ocean floor to increase buoy stability. Each tether 204 may include one or more magnetostrictive devices 200 and other load-bearing members. An example of this embodiment is shown in FIG. 2-2, which illustrates one embodiment of tether systems to secure magnetostrictive elements 200 to buoys 206. FIG. 2-2 also illustrates a specific embodiment of one of the magnetostrictive devices 200, which includes a magnetostrictive rode (core) 202, electrical coil 210, protective casing 214, external electrical connections 218, and structural attachment elements 220.

Figures 1, 2, 3, 4, 5, 6, 7, 8, 9:
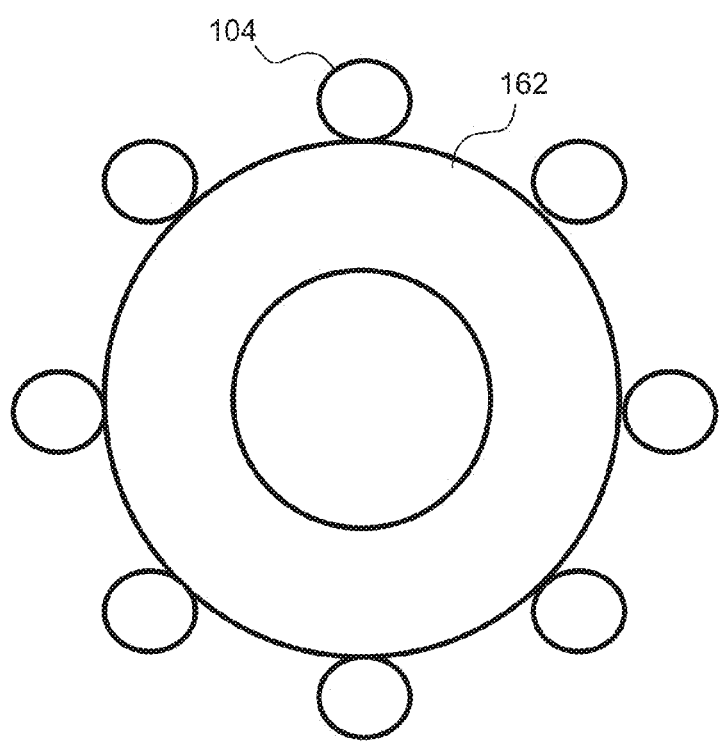
Figures 1, 2:
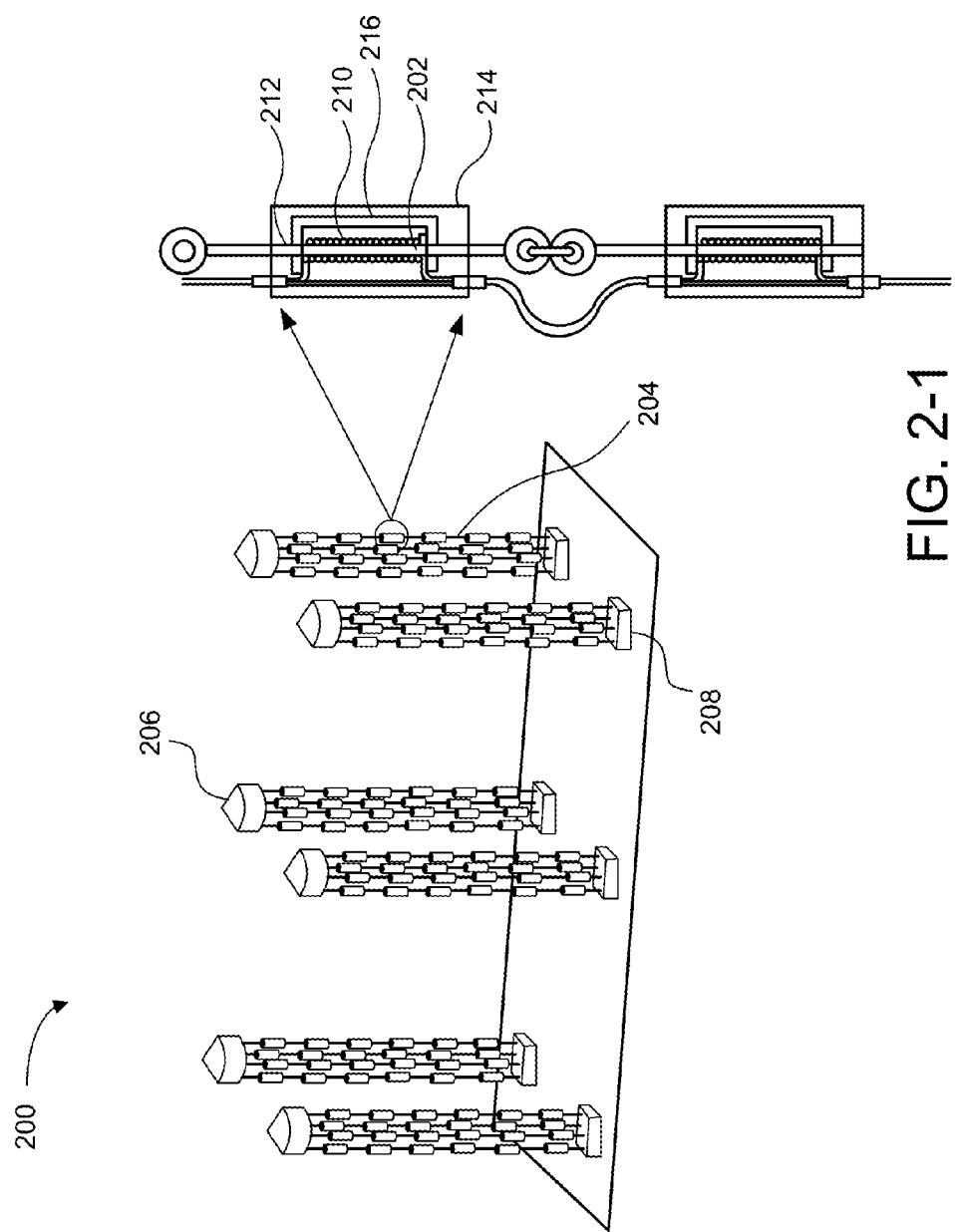
Figure 2:
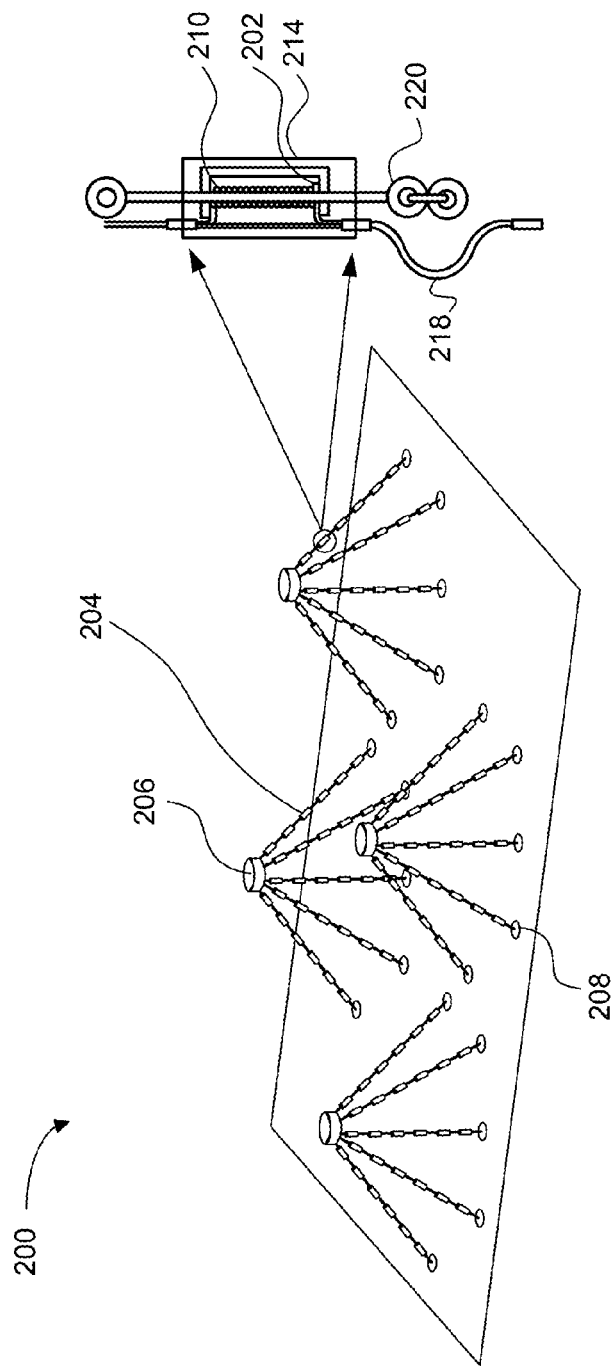
Figures 2, 3:
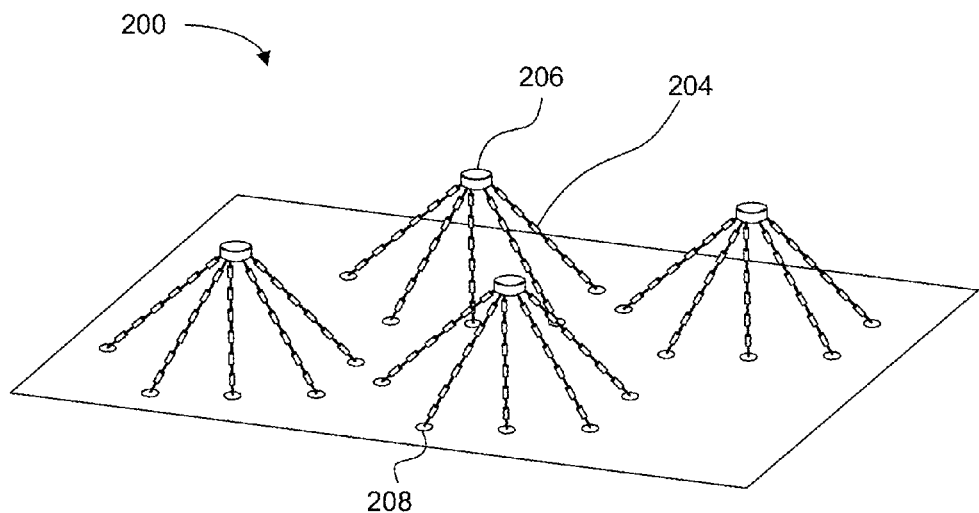
Figures 2, 3, 4:
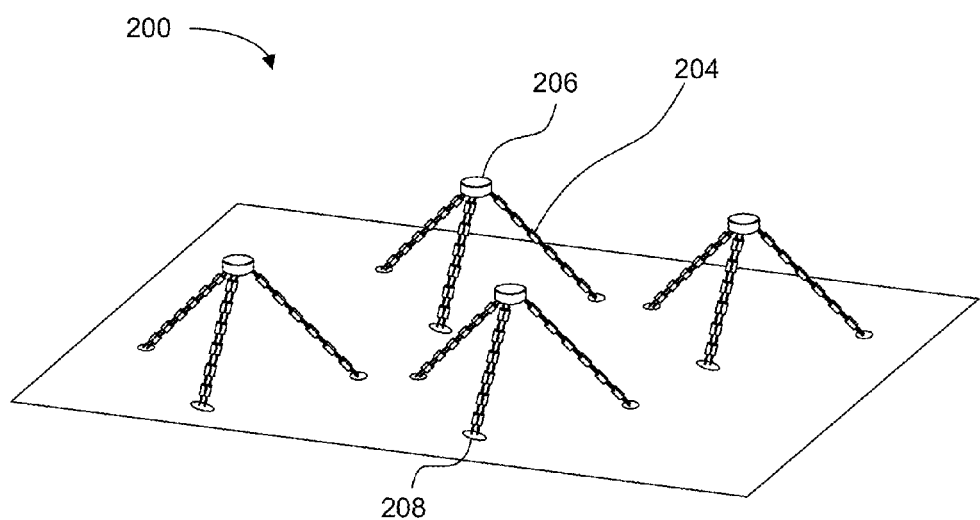
Figures 2, 3, 4, 5, 6:
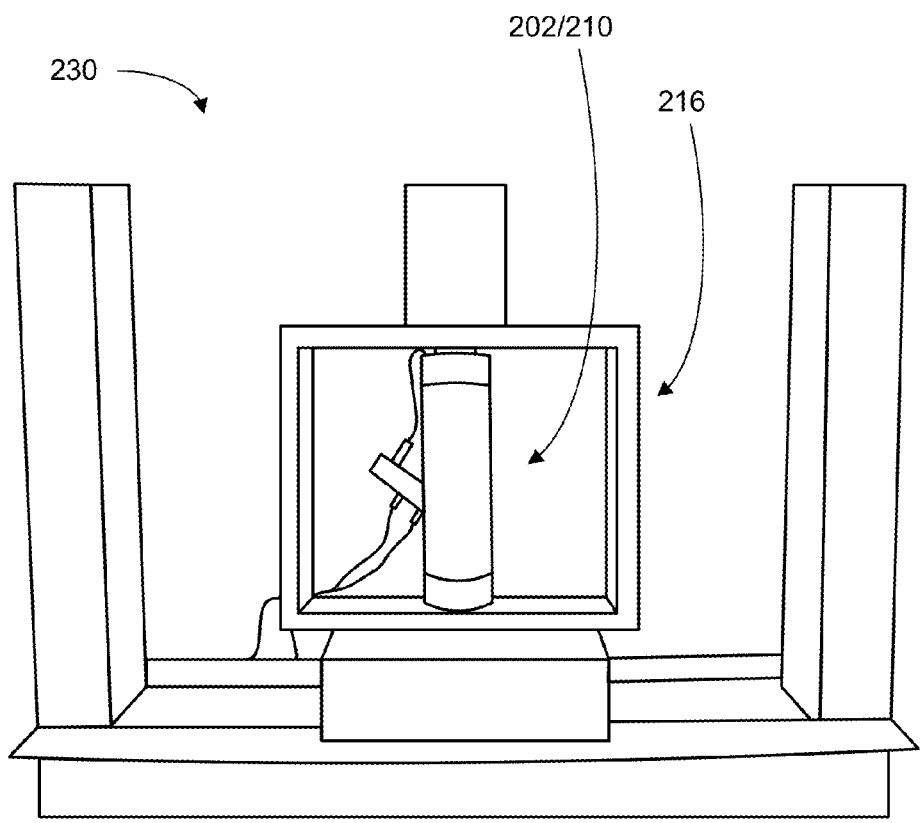
Figures 2, 3, 4, 5, 6, 7:
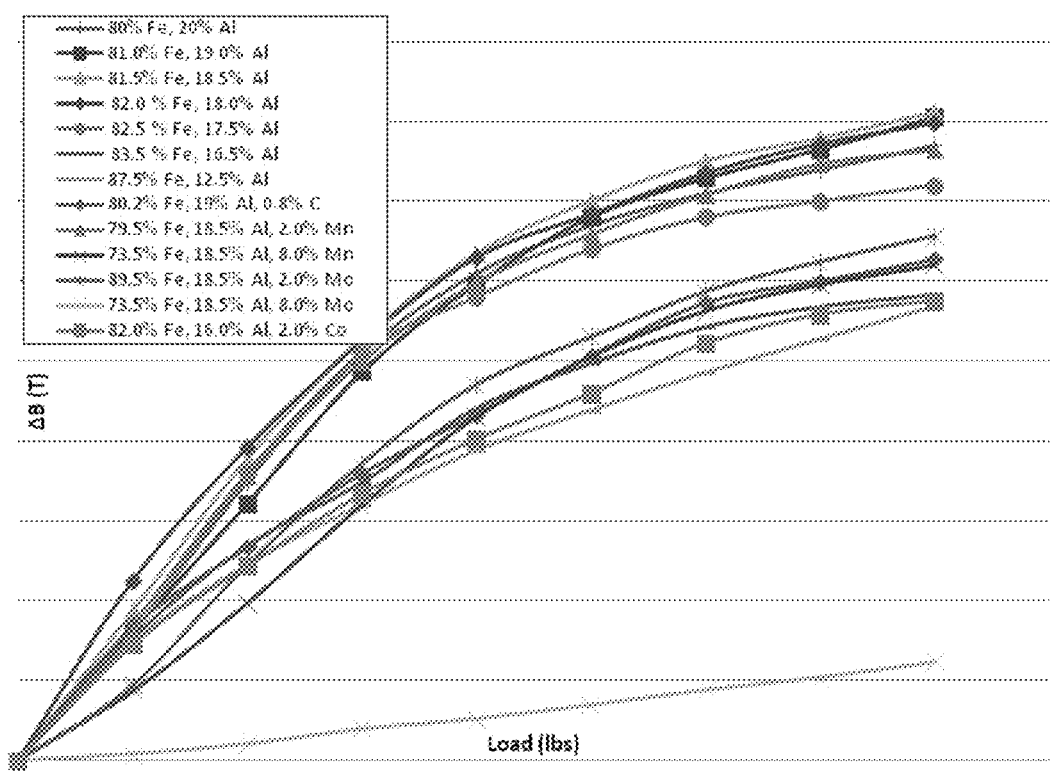
Figures 2, 3, 4, 5, 6, 7, 8, 9:
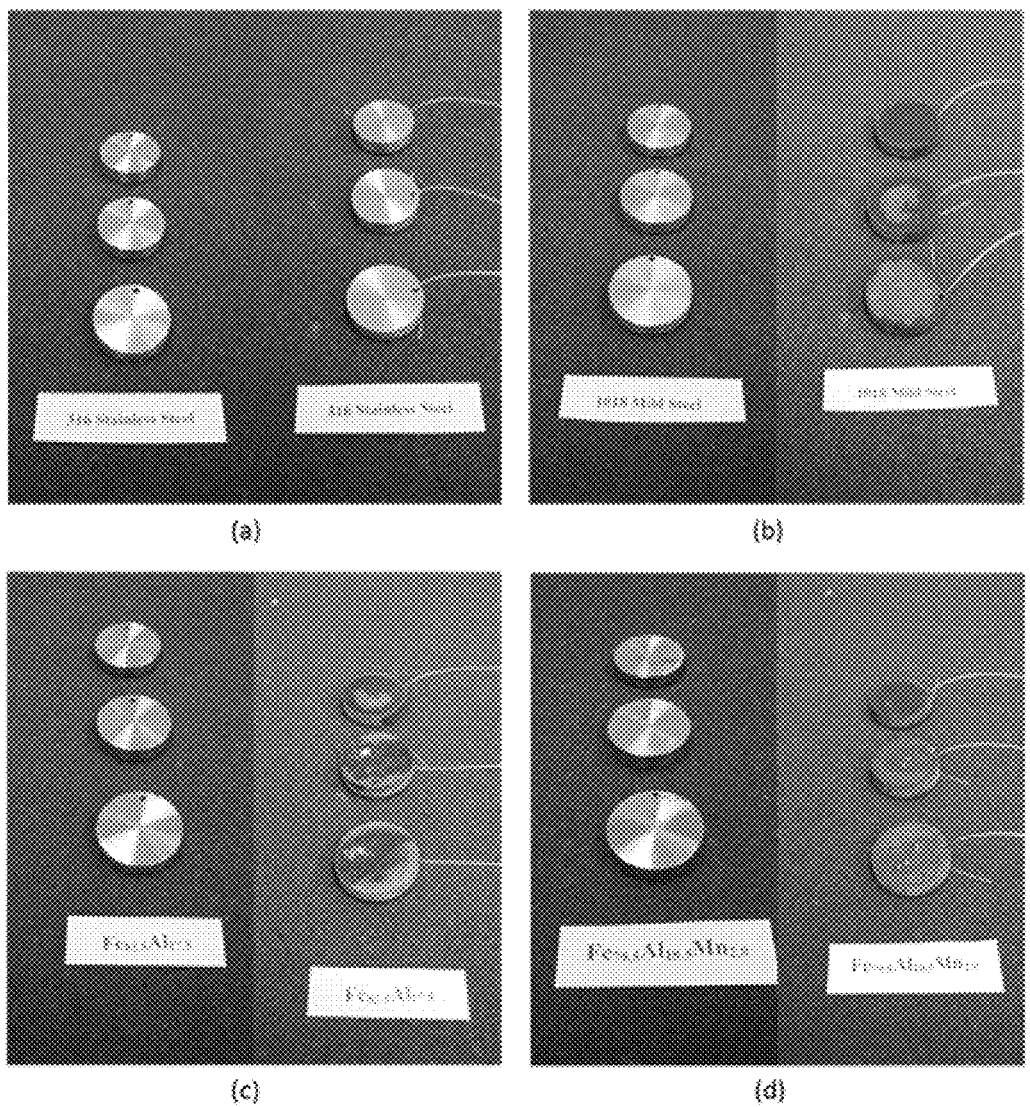
Figures 2, 3, 4, 5, 6, 7, 8, 9, 10:
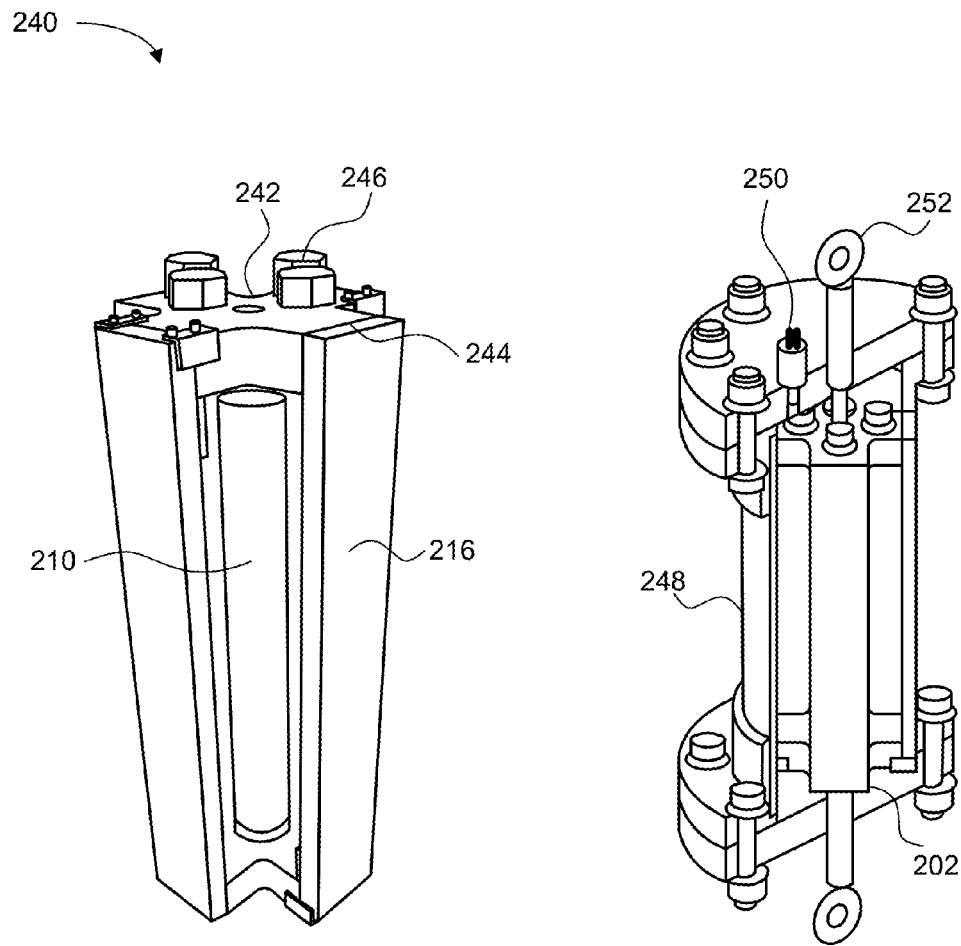
Figures 2, 3, 4, 5, 6, 7, 8, 9, 10, 11, 11A, 11B:
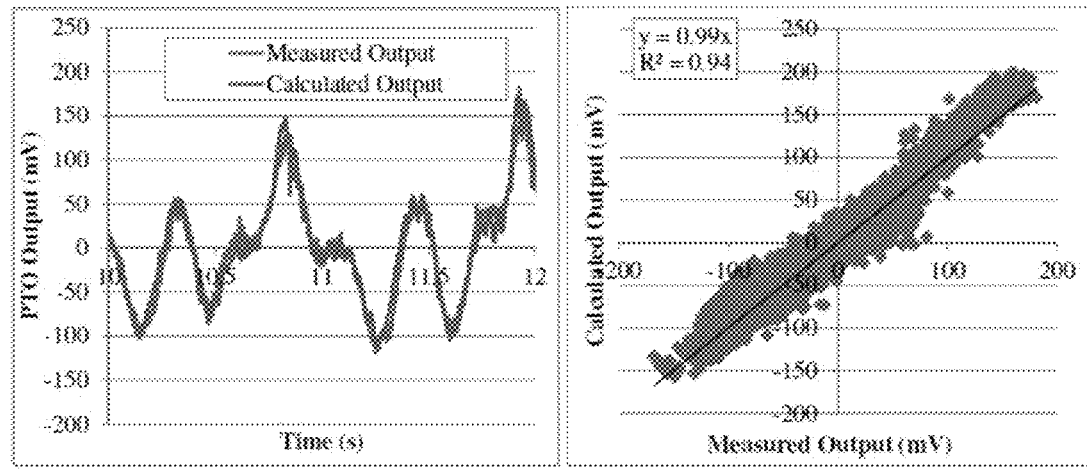
Figures 2, 3, 4, 5, 6, 7, 8, 9, 10, 11, 12:
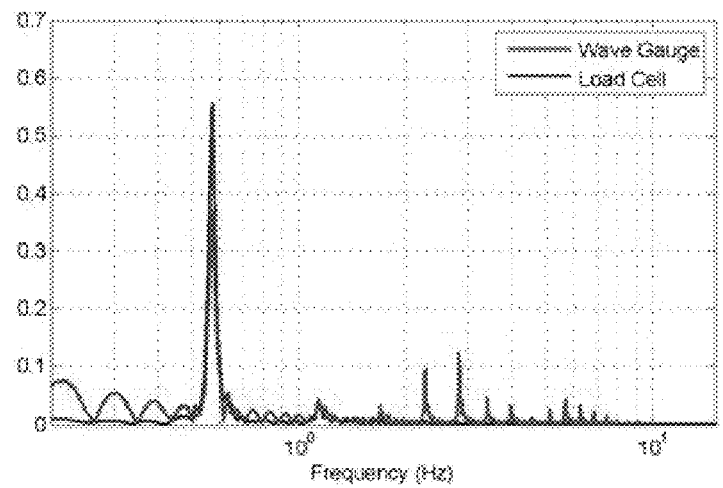
Figures 2, 3, 4, 5, 6, 7, 8, 9, 10, 11, 12, 13:
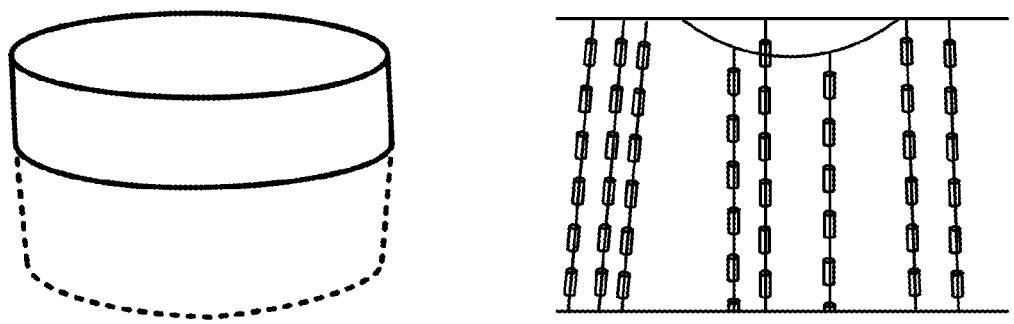
Figures 2, 3, 4, 5, 6, 7, 8, 9, 10, 11, 12, 13, 14, 14A:
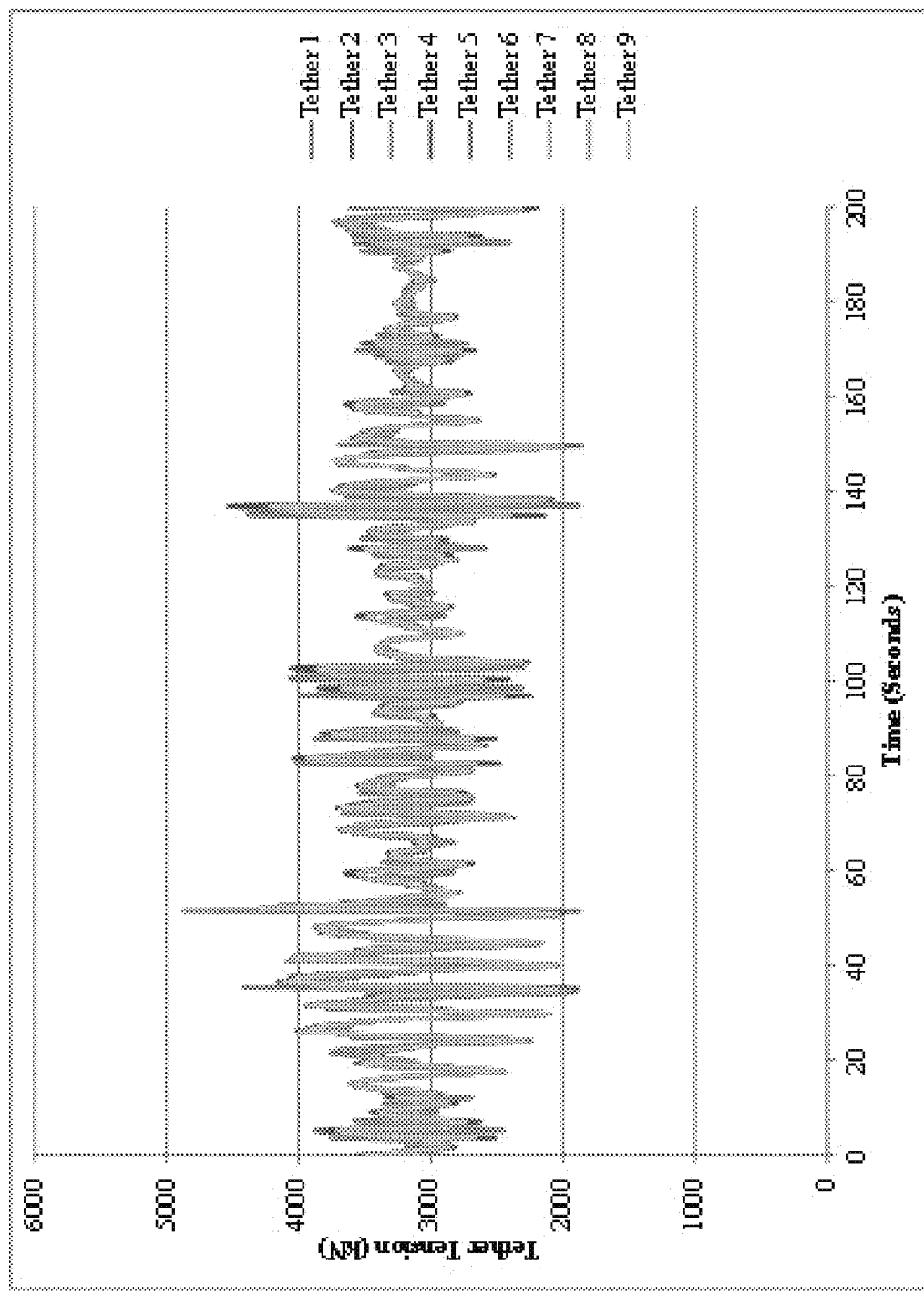
Figures 2, 3, 4, 5, 6, 7, 8, 9, 10, 11, 12, 13, 14, 14B:
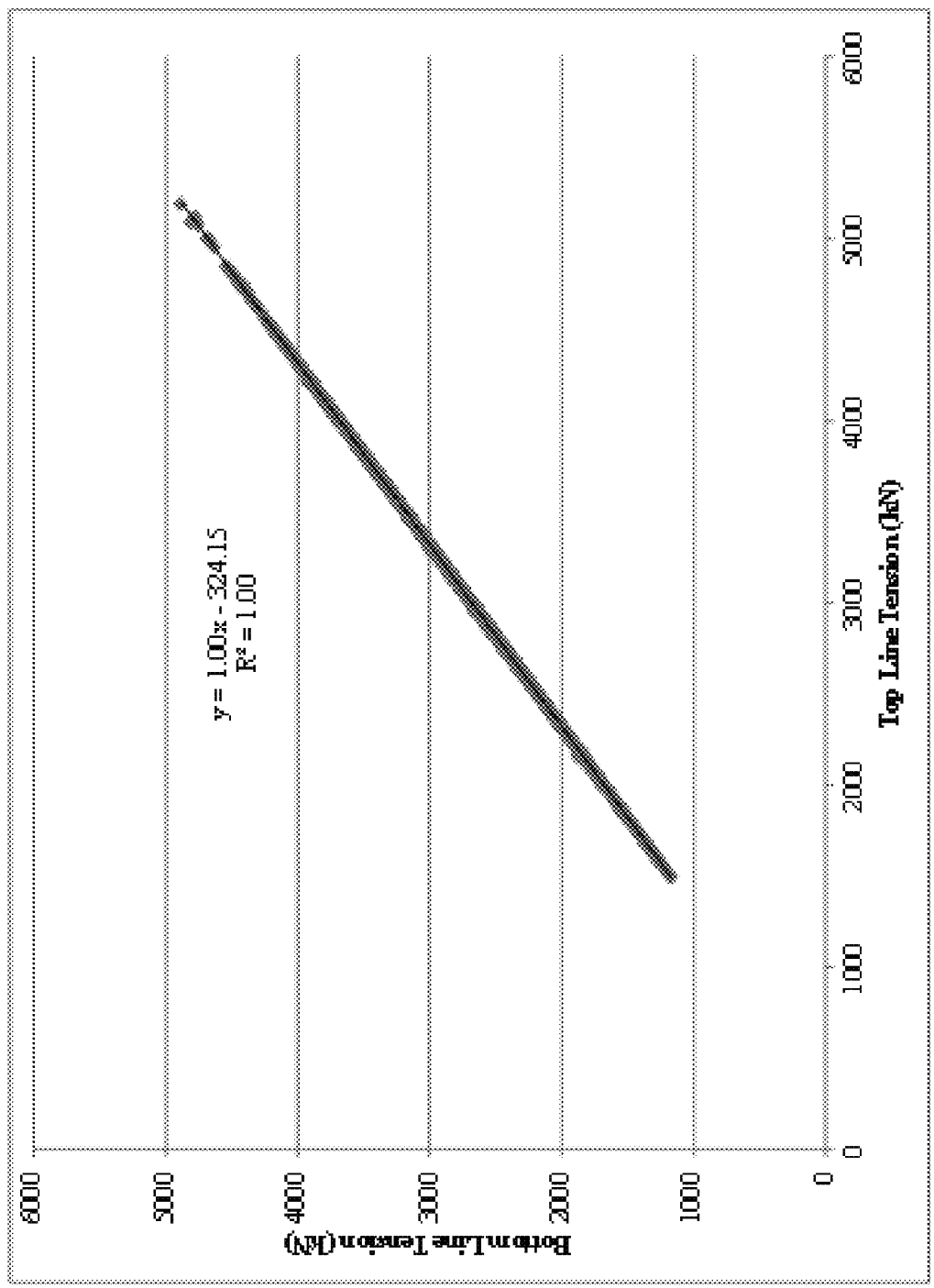
Figures 1, 3:
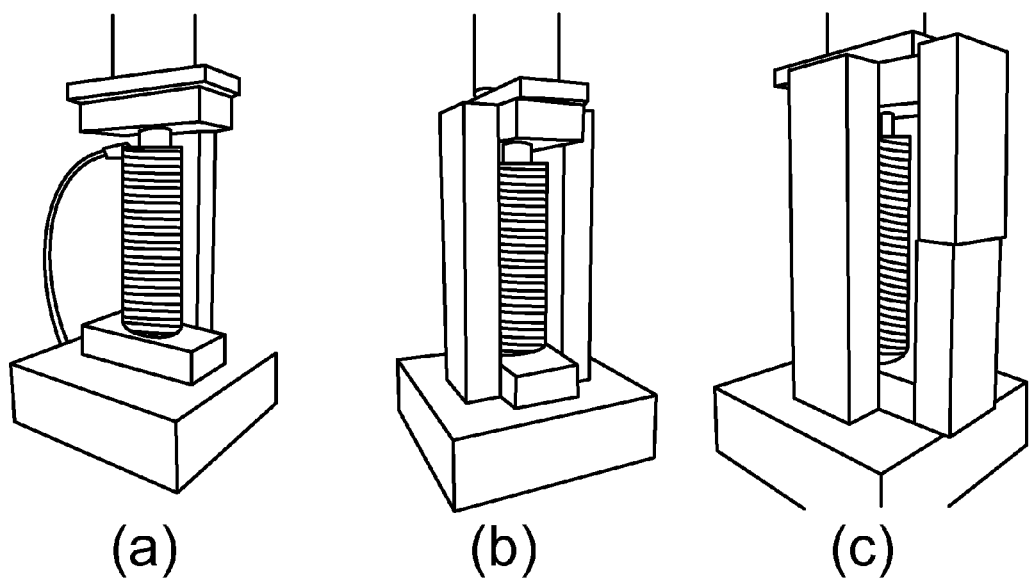
Figures 2, 3:
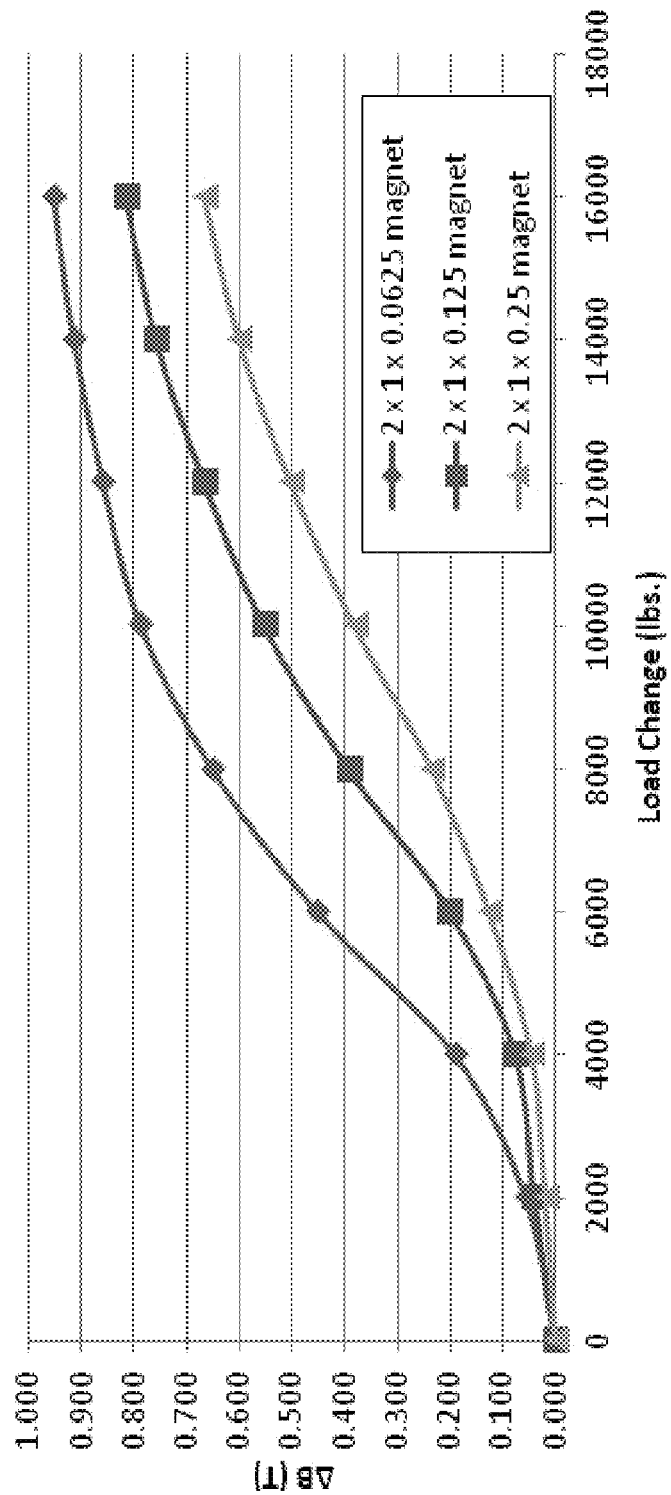
Figure 3:
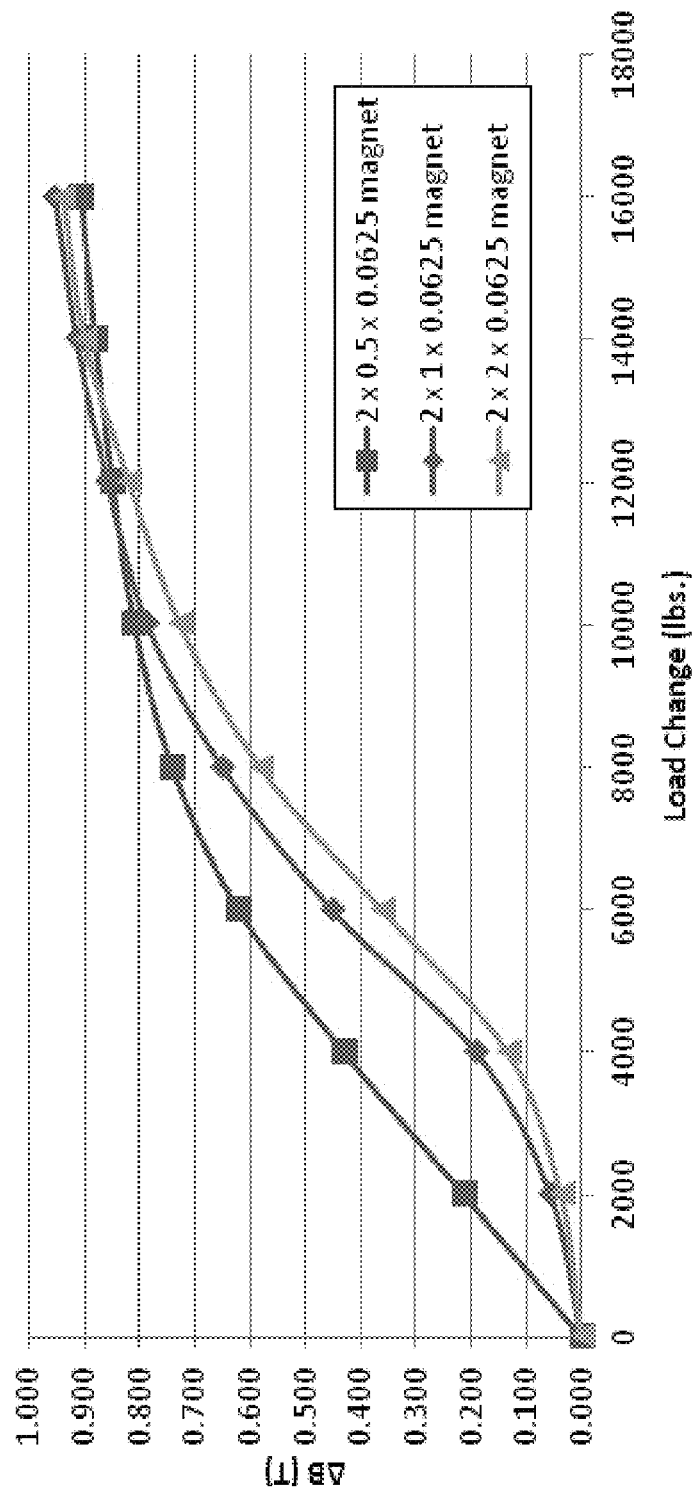
Figures 3, 4:
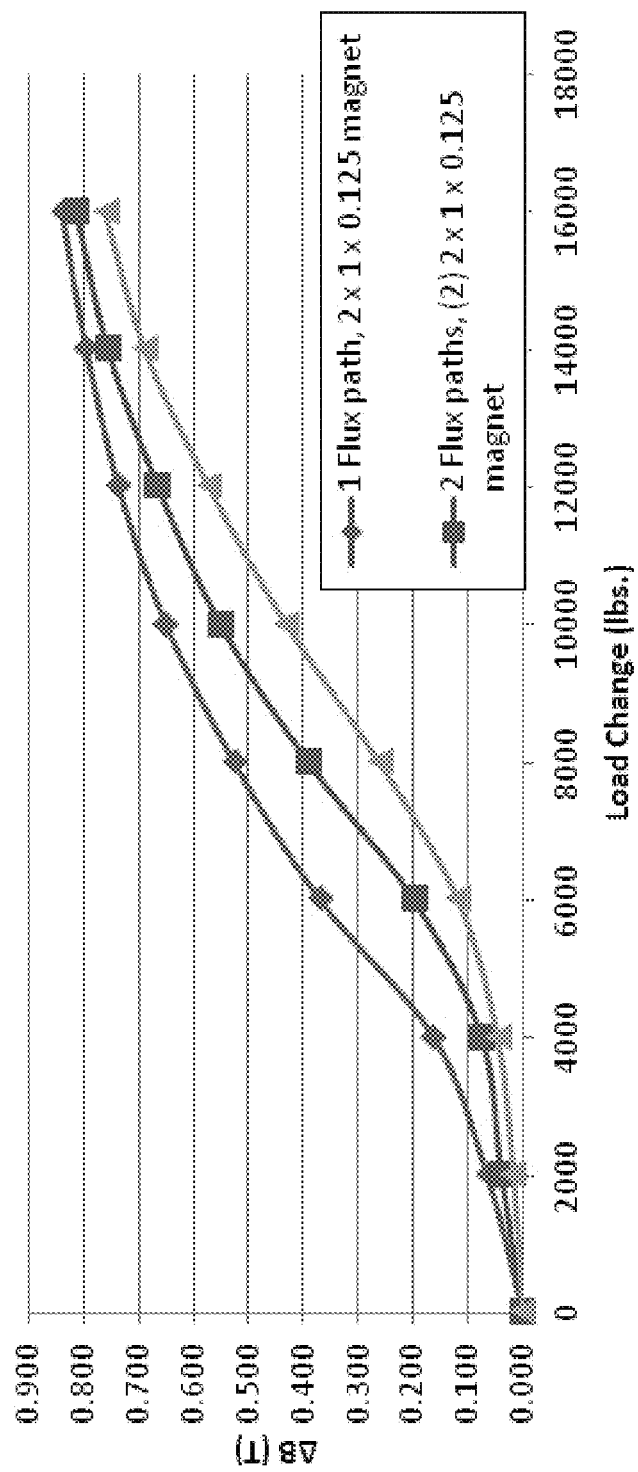
Figures 3, 4, 5:
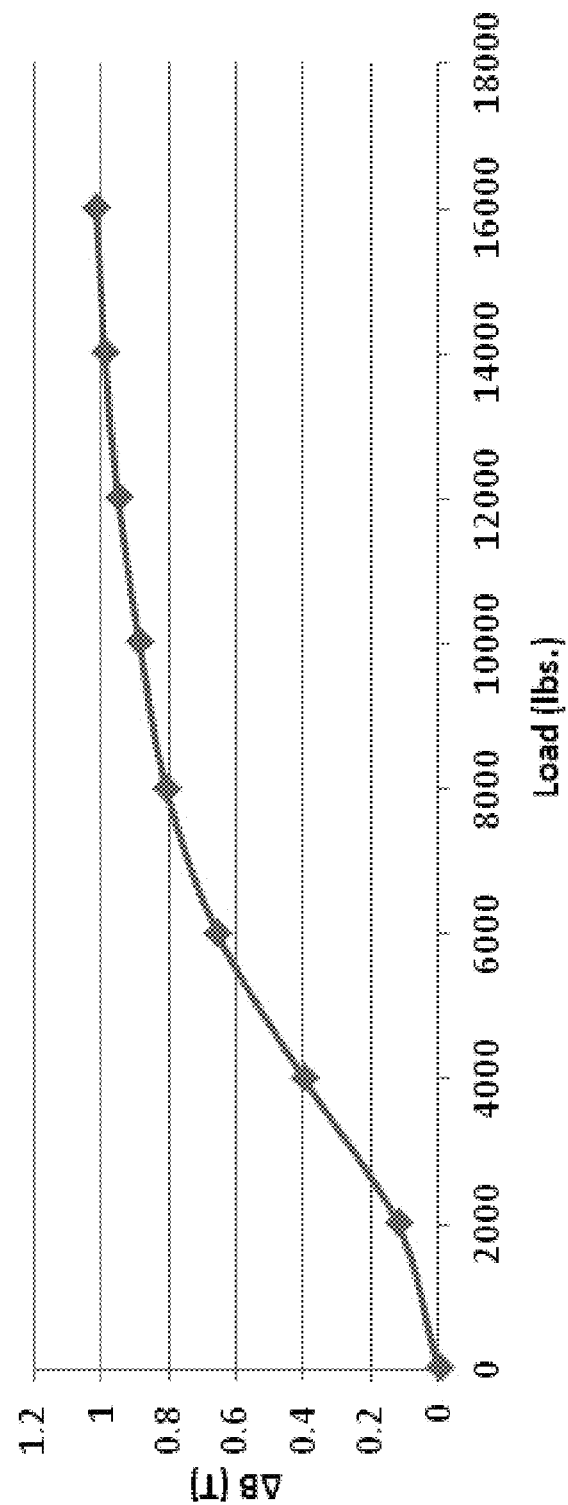
Figures 3, 4, 5, 6:
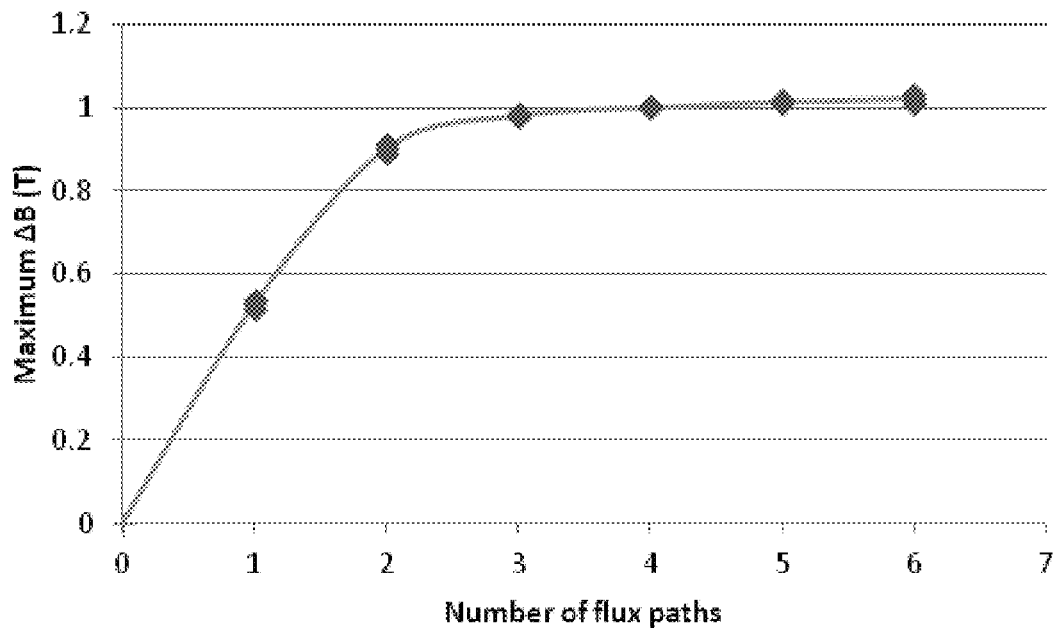
Figures 3, 4, 5, 6, 7:
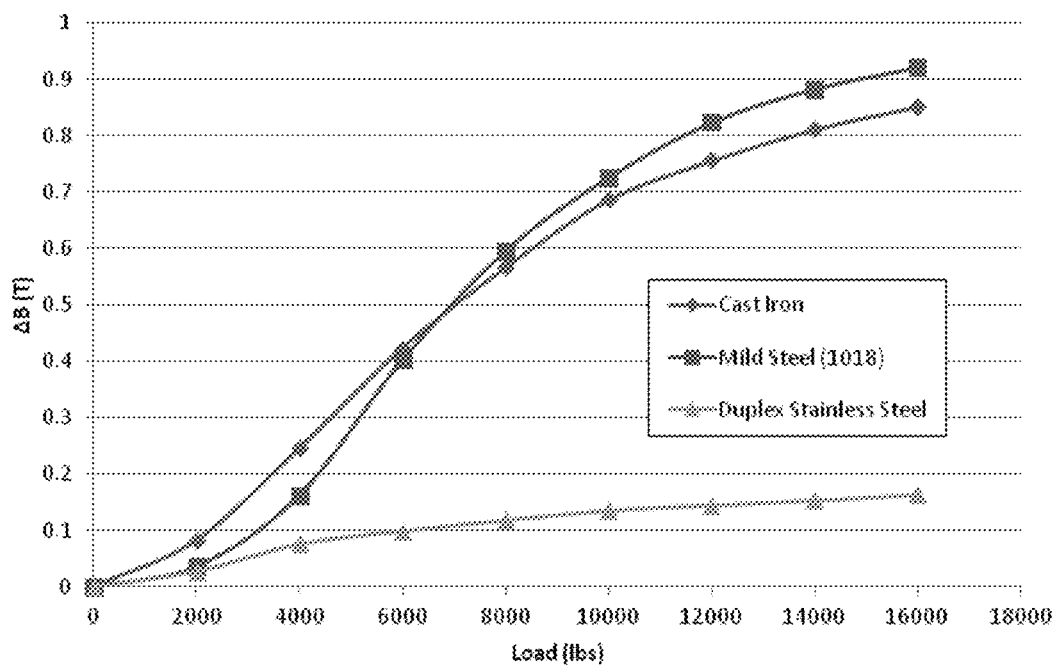
Figures 3, 4, 5, 6, 7, 8:
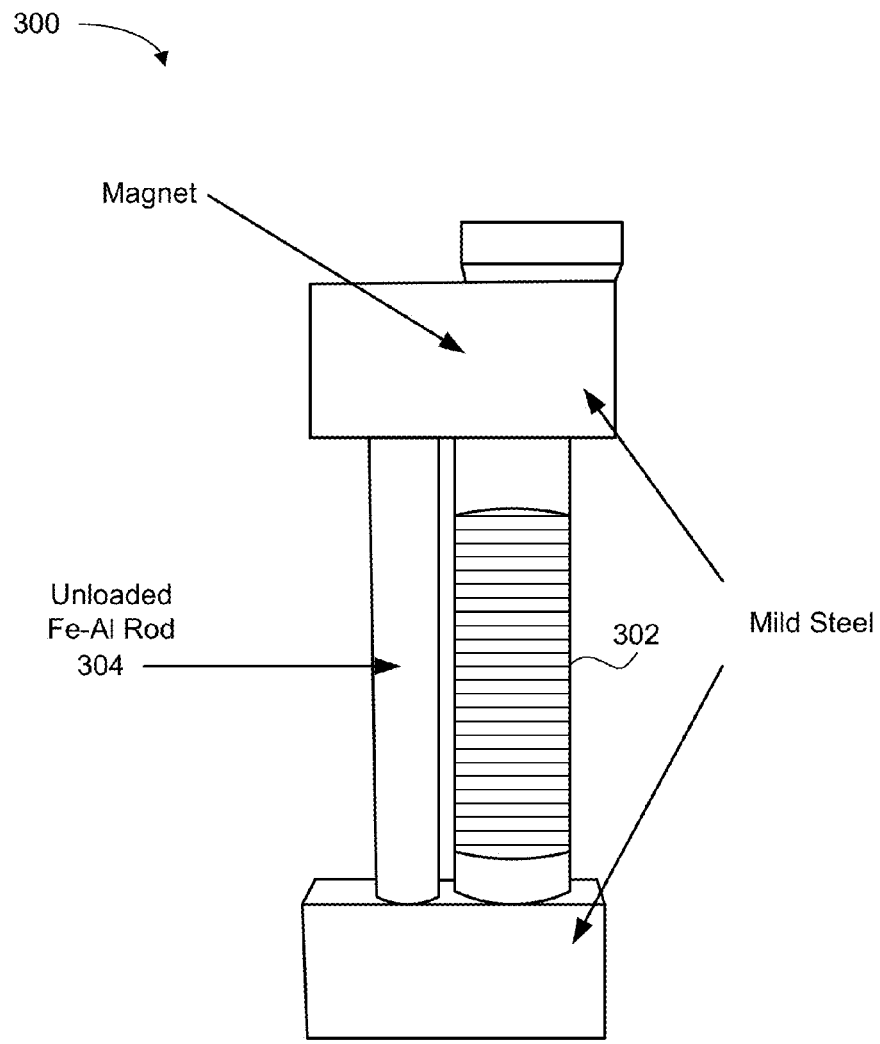
Figures 3, 4, 5, 6, 7, 8, 9:
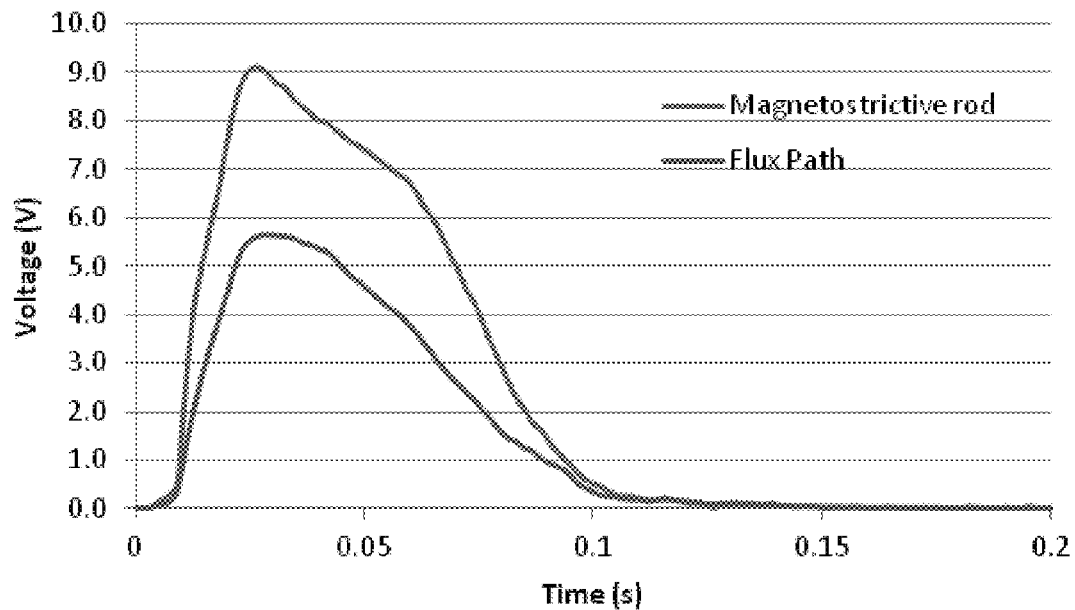
Figures 3, 4, 5, 6, 7, 8, 9, 10:
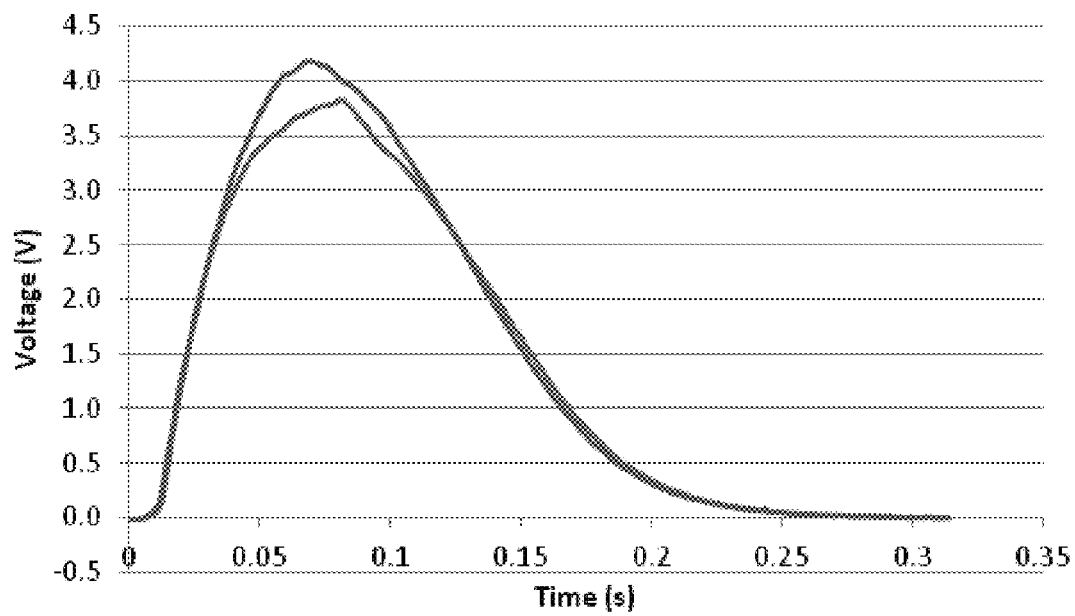
Figures 3, 4, 5, 6, 7, 8, 9, 10, 11:
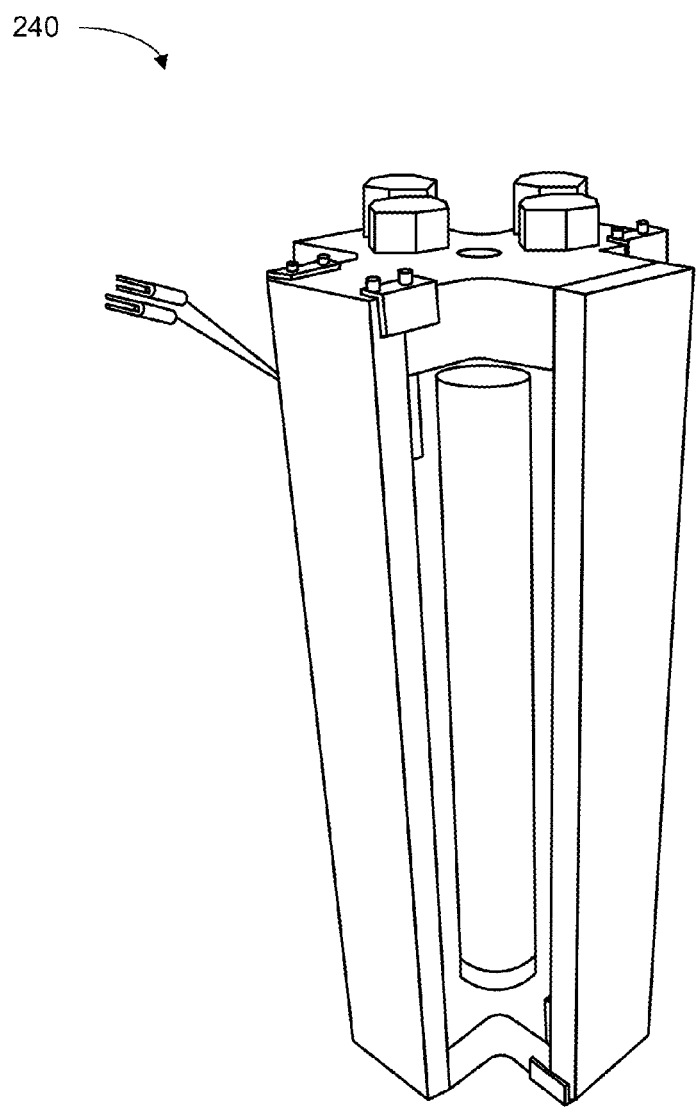
Figures 3, 4, 5, 6, 7, 8, 9, 10, 11, 12:
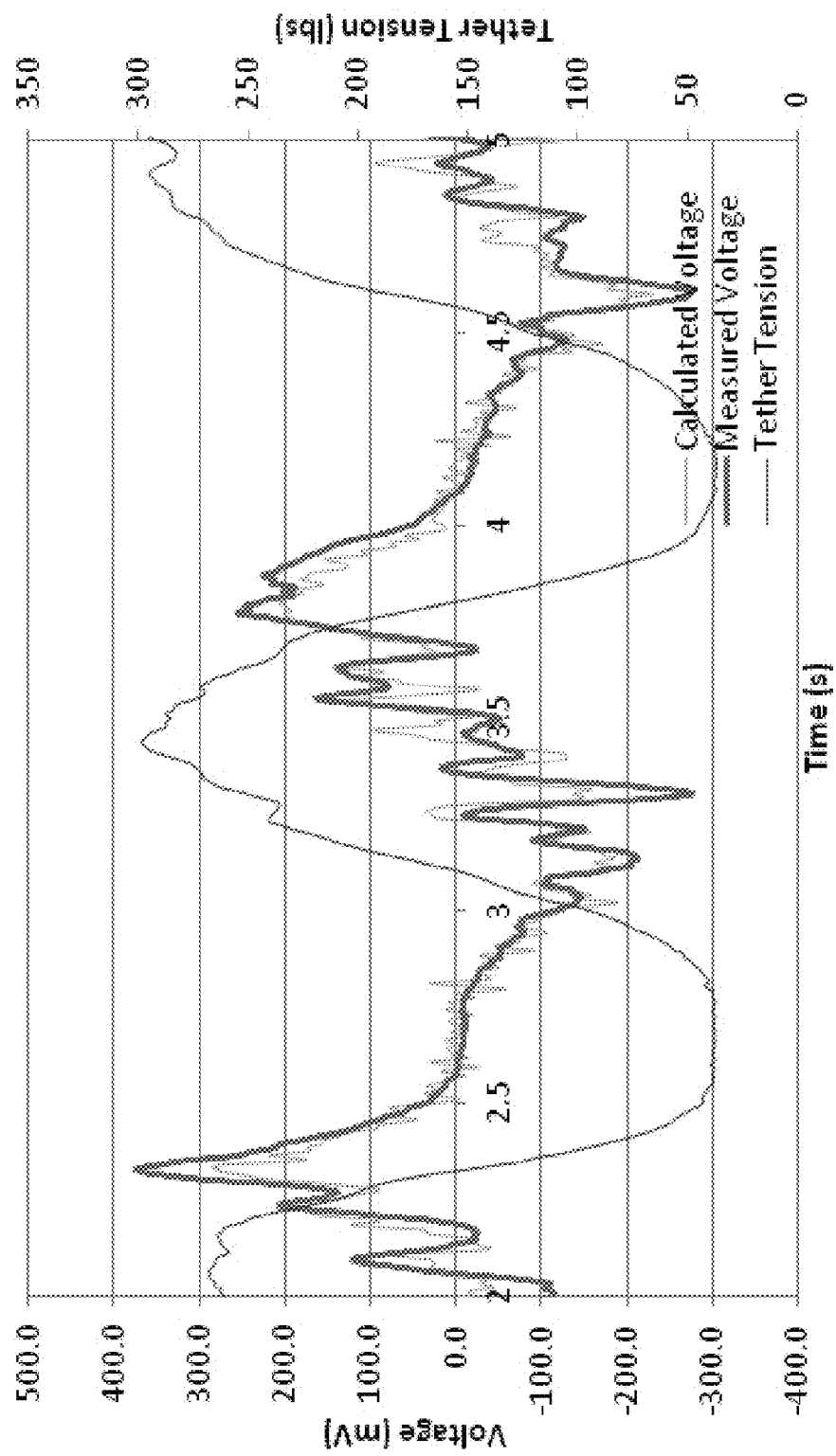
Figures 3, 4, 5, 6, 7, 8, 9, 10, 11, 12, 13:
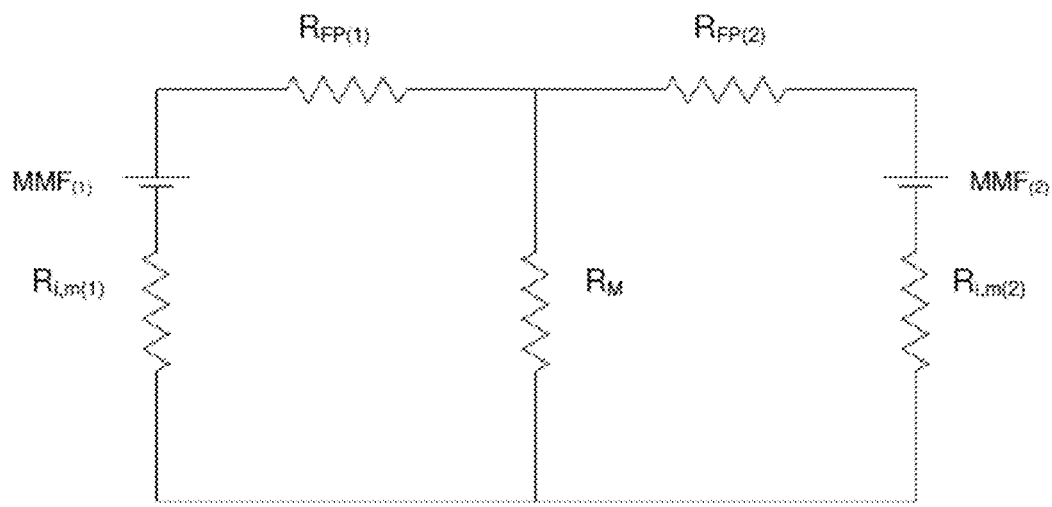
Figures 3, 4, 5, 6, 7, 8, 9, 10, 11, 12, 13, 14:
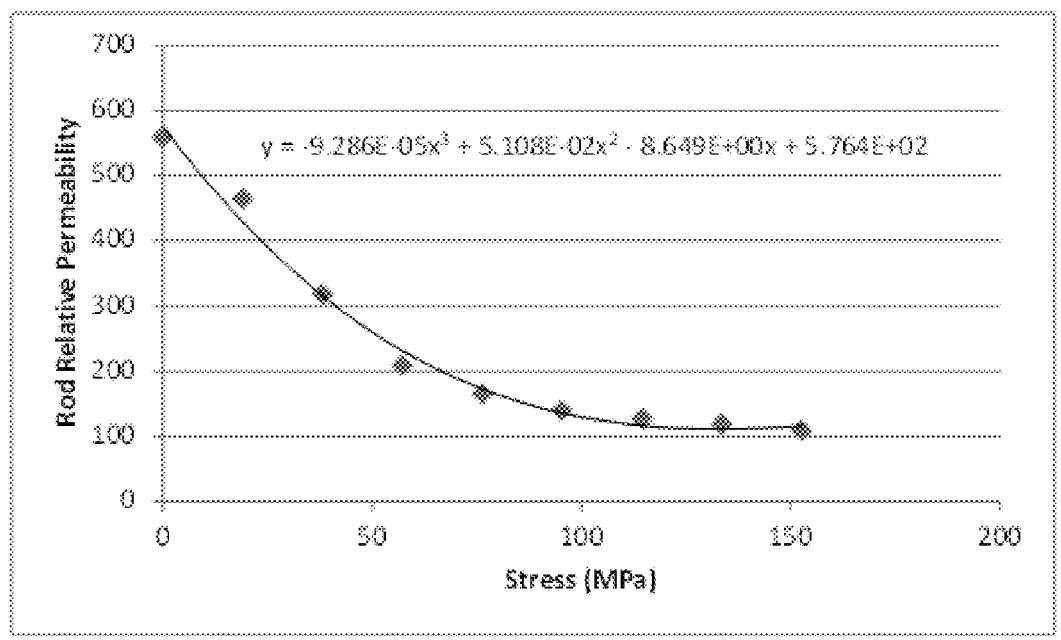
Figures 3, 4, 5, 6, 7, 8, 9, 10, 11, 12, 13, 14, 15:
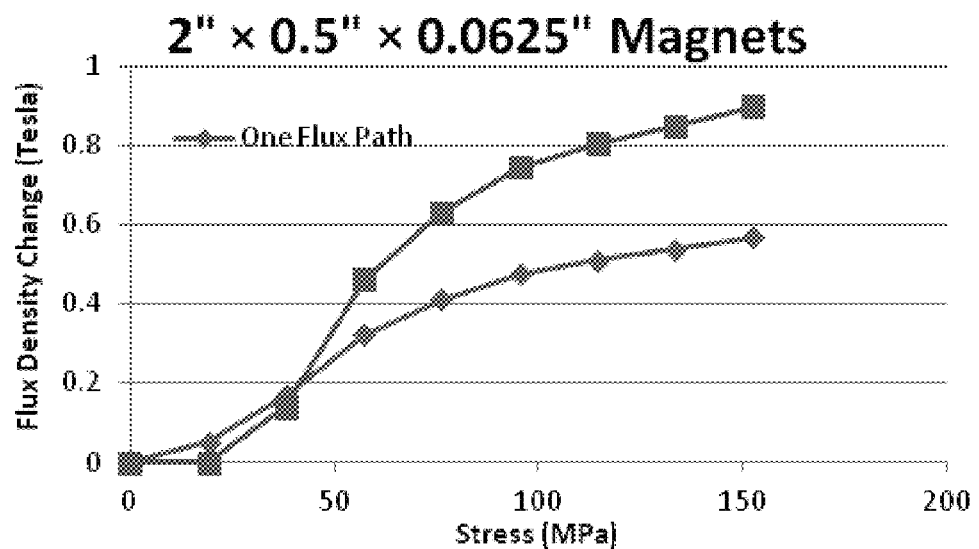
Figures 3, 4, 5, 6, 7, 8, 9, 10, 11, 12, 13, 14, 15, 16:
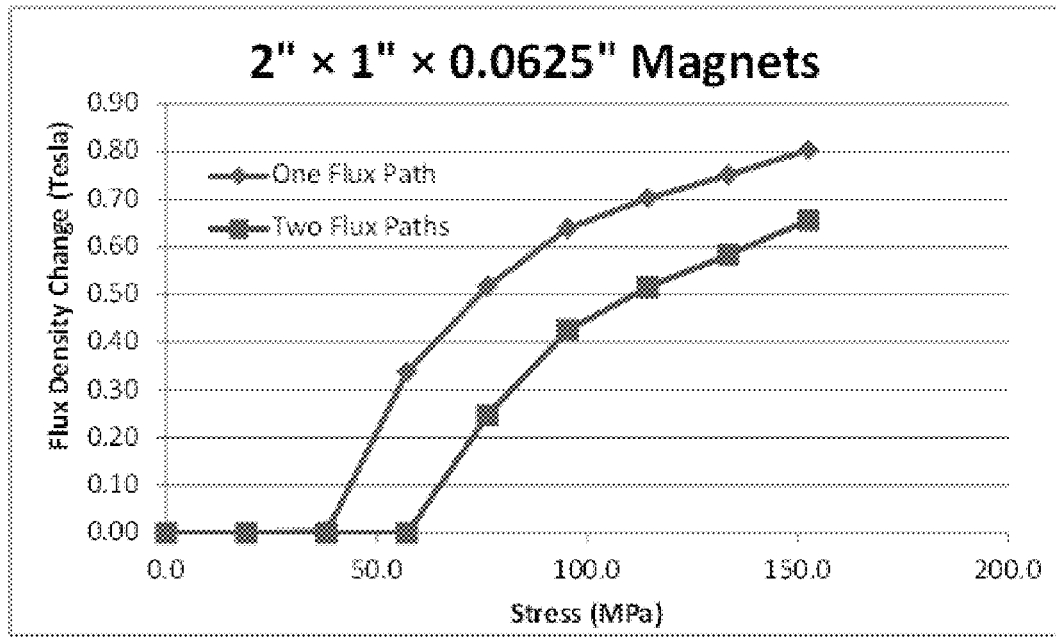
Figures 1, 4:
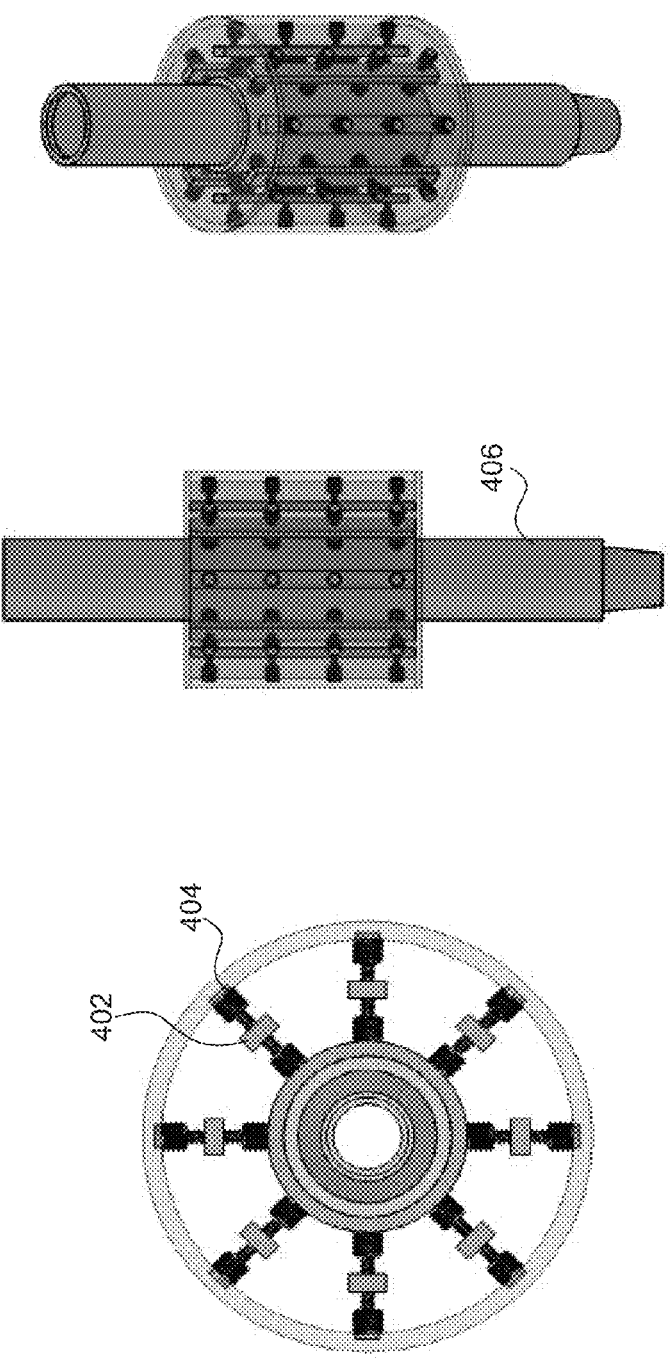

In some embodiments, the tethers 204 might be at an inclination angle from 1° to 89° relative to the ocean floor, and will likely be from 30° to 60°, as shown in FIG. 2-3. This angle leads to improved hydrodynamic stability of the buoy 206, and less motion, which equates to better load transfer to the tethers 204 and consequently the energy harvesting device 200. Hydrodynamic modeling of the buoy 206/tether 204/ energy harvester system 200 may be used to determine specific installation angles for a given installation location and environment. In some embodiments, the groups of one or more tethers 204 may extend from the corresponding buoy 206 in approximately the same radial direction, with the tether system comprising multiple such groups of parallel tethers 204, as shown in FIG. 2-4. Another embodiment includes another type of water flotation device in addition to, or instead of, the one or more buoys 206.

Experiments were performed to measure alloy flux density change. Candidate alloys were selected based on literature results that showed a peak in magneto-mechanical coupling for iron-aluminum alloys at an atomic Al percentage between 16 and 19 and maximum energy density for iron-gallium alloys at an atomic Ga percentage in a similar range. Tests were performed to determine if, based on their position in the periodic table, Fe—Al performs similarly to Fe—Ga in reverse magnetostriction. Other sources have demonstrated that adding a tertiary element could also be beneficial: Co and C to improve the magneto-mechanical coupling coefficient and magneto-elastic coupling, Mn to increase the electrical resistivity of the alloy and thereby decrease losses due to eddy currents, and Mo to reduce corrosion weight loss while increasing strength and ductility. Based on these previous findings, processes and tests were performed on five binary compositions of Fe—Al and seven tertiary compositions in which a third element was added to an Fe—Al base composition. These alloy compositions are summarized in the table shown in FIG. 2-5. Also included in the table are three other alloys (marked with an asterisk) that were tested previously.

The alloys were cast by Sophisticated Alloys, Inc. (Butler, Pa.) using a vacuum-induction technique that produced 14" long rods with a 1.25" diameter. These rods were machined through either centerless grinding or turning on a lathe to a final diameter of 0.96" and cut to a length of 6.25".

To determine the reverse magnetostrictive performance of each alloy, the change in magnetism ($\Delta B$) of each specimen was quantified as a function of change in compressive loading. In each test, a bias magnetic field was applied to the magnetostrictive element 202, which was then compressed in a hydraulic loading system 230, as shown in FIG. 2-6. Neodymium rare-earth magnets provided the magnetomotive force (MMF), which was directed through the specimen by flux paths 216 composed of mild steel (1018) bars. The results presented here are for a configuration with two flux paths, each with one 2"×0.5"×0.0625" NdFeB magnet, and these paths were magnetically isolated from the steel frame of the loading system using aluminum separators. The compressive load was quickly released, and the change in magnetic flux induced a voltage in a copper-wire coil 210 around the specimen, which was recorded with a data-acquisition system (not shown). The voltage change as a function of time was then used to calculate the change in magnetism.

The magneto-mechanical performance was a strong function of the alloy composition. FIG. 2-7 shows the change in magnetic flux density for a change in applied load. The maximum change in flux density for each alloy composition is also summarized in the table shown in FIG. 2-5.

The 18.5% Al alloy demonstrated the highest change in flux density, while the 18.0% Al alloy had the highest value of $dB/d\sigma$. All of the ternary compounds, with the exception of the 2.0% Mn alloy, showed significantly reduced values for both $\Delta B$ and $dB/d\sigma$. It should be noted that the absolute magnitude of $\Delta B$ and $dB/d\sigma$ are dependent on the particulars of the configuration being tested, e.g., the number of flux paths, magnet thickness and cross-sectional area, etc., but the relative performance seems to hold over the configurations tested.

The resistivity of each alloy, which is important because higher resistance levels reduce eddy currents and thus increase efficiency, was tested with a four-point resistance measurement. The results of these measurements are also summarized in the table shown in FIG. 2-5. All of the alloys have a resistivity between those of iron ($1.0 \times 10^{-7}$ $\Omega \cdot m$) and aluminum ($2.8 \times 10^{-8}$ $\Omega \cdot m$), as would be expected. Consistent with conventional teachings, the addition of 8.0% Mn nearly doubled the electrical resistance. However, the reduction in magnetic flux density likely offsets the potential benefit for low frequency applications such as the ocean wave harvester. However, the Mn-doped material may be of interest in other high-frequency applications such as vibration energy harvesters.

Corrosion coupons were machined from six alloys for saltwater testing. One alloy was a representative binary alloy, and the others were ternaries chosen to evaluate the effect of the tertiary compound on corrosion resistance. The coupons were nominally 1.25" diameter with a 0.25" thickness.

The 17.5% Al was chosen as the baseline binary composition, to which the Mn, Mo and Co ternaries were compared. Stainless steel (316) was also tested as a control sample. Mild steel (1018), which is the material used in some embodiments for flux paths, was also tested. Three coupons of each alloy were tested. The weight of each coupon was measured after which it was suspended in a separate container of filtered, sterilized and pH buffered ocean water (specific gravity=1.025, pH=8.3) for 21 days. Upon removal from the salt water, the coupons were rinsed and scrubbed to remove corrosion products, and then weighed to determine the corrosion rate per unit area that is summarized in the table shown in FIG. 2-5.

The stainless steel had a very low corrosion rate as expected (−0.4 g/m$^2$·yr), while the mild steel had moderate weight loss (48.0 g/m$^2$·yr). All of the Fe—Al alloys exhibited weight gain except for the 8.0% Mo specimen. This is likely due to the formation of a surface scale that is sufficiently adherent to the alloy coupons that it could not be washed off by rinsing. While this may be studied in more detail, such scale formation could result in a passivation layer formation that reduces corrosion rate over time. A visual inspection was also performed where each coupon was qualitatively rated in terms of appearance. Before and after images of four of the corrosion coupons (labeled a through d) are shown in FIG. 2-9. The five alloys with tertiary elements had very little visual difference, and so are represented by the 2.0% Mn alloy. The stainless steel (316) coupons show almost no corrosion; otherwise the 17.5% Al alloy appears to have performed the best. It should also be noted that while the surface corrosion is visually obvious, the largest change in weight observed was 0.1% for the 8.0% Mn alloy, which is nearly twice that of any of the other alloys. It is quite possible that this would likely mean that small leaks, even if they occur, will not result in catastrophic failure of the alloy rods, and is more likely to result in a slow decline in alloy rod power production.

The observation that corrosion of the alloys was significant, and could not be significantly mitigated by small alloying additions, necessitates a fail-safe sealing mechanism that ensures that the elements are not directly exposed to seawater over the lifetime of the product.

The results from the magnetostrictive performance testing were incorporated into a sub-scale power take-off (PTO) module 240, which was bench and wave-tank tested. FIG. 2-10 illustrates one embodiment of a PTO module 240. The illustrated PTO module 240 includes a larger (11" long, 1.125" diameter) magnetostrictive rod 202 in a compression fixture 242. (i.e. load-bearing structure). The compression fixture 242 included four flux paths 216, each of which included a 2"×1"×0.0625" rare-earth magnet 244, and stainless-steel bolts 246 to apply a bias compressive force to the magnetostrictive alloy 202. The system was designed such that an external tensile load would relieve the pre-compression, causing a magnetic flux change and an attendant voltage change. This fixture was housed inside a PVC enclosure 248 designed to transfer external mechanical loads to the internal compression fixture with watertight electrical connections 250 for taking measurements.

Bench testing of the sub-scale PTO module 240 was accomplished by applying a cyclic tensile load to the PTO module 240 while measuring the open-circuit voltage output. The force was applied by hand using a lever arm that allowed load changes of about 300 pounds, which were measured with a load cell (not shown). While this load was more than an order of magnitude lower than what an alloy rod of this diameter would be designed for and would be expected in ocean operation with an appropriately sized buoy, it was representative of the load changes that would be experienced in the wave tank, and it could be applied in a more controlled manner than that of the electro-hydraulic press shown in FIG. 2-6, which is limited to square-wave loading.

The measured load and voltage of bench testing results of the assembled device 240 were low-pass filtered at 55 Hz to remove the noise associated with line voltage. The predicted voltage was calculated using Faraday's law of induction, $$V = N(dB/d\sigma)(d\sigma/dt),$$

where N is the number of turns of the coil, A is the cross-sectional area of the rod, B is the magnetic flux density, and a is the applied load. The value of $dB/d\sigma$ was found by minimizing the standard deviation of the difference between the actual and calculated voltages. The predicted voltage has excellent agreement with the measured output, with an R-squared of 0.98. The magnitude of $dB/d\sigma$ is roughly one third of the value arrived at through magneto-mechanical performance testing. This is due to load sharing between the magnetostrictive rod and the bolts in the compression fixture. Before testing it was predicted that only 30% of the applied load would be felt by the magnetostrictive, which agrees well with this testing. An analysis shows that through optimization of the compression fixture it should be possible to push this value to 90%.

PTO module testing was conducted both with and without the PVC enclosure 248 to verify that the enclosure 248 did not adversely affecting load transfer. Despite the use of static seals, $dB/d\sigma$ decreased by only 2% with the enclosure 248. With further optimization through the use of a bellows seal, it appears that this loss can be reduced even further. Finally, the device was successfully leak-tested by submerging it in a tub of water overnight, to verify its leak-tightness prior to the wave-tank testing.

Wave-tank testing was performed at the UC-Berkeley Marine Mechanics Wave Flume, located at the Richmond Field Station in Berkeley, Calif. The work was performed in collaboration with Marine Innovation and Technology (MI&T, Berkeley, Calif.), a naval architecture and offshore platform consultancy. One end of the PTO module 240 was attached to a cylindrical buoy 206 with a fully submerged buoyancy of 600 lbs. The other end of the PTO module 240 was attached to a rope that ran through an anchored pulley and up to a movable carriage. A load cell was placed in series with the PTO module 240 to measure line tension. Output voltage and wave height were also measured. Waves with crest-to-trough heights ranging from 6" to 10" and periods ranging from 0.75 s to 2.0 s were generated over the course of the test.

The results from a typical run are shown in FIGS. 2-11a and 2-11b. These results correspond to a particular test with 10" waves with a period of 1.1 s. The predicted voltage was arrived at using the value of $dB/d\sigma$ found during bench testing, which provides an excellent fit to the measured voltage ($R^2$=0.94). This is important because it provides confidence in an ability to predict performance in wave environments based on previous bench-top results.

An interesting observation from the data presented in FIGS. 2-11a and 2-11b is that the tether tension, while periodic, is clearly different than the nearly sinusoidal wave profile. There is a significant amount of energy contained at higher frequencies, as can be seen in the amplitude spectra of the tension, which is shown in FIG. 2-12. While almost all of the frequency content of the wave-gauge signal occurs at 0.571 Hz (1.75 s period) and its first harmonic, 1.14 Hz, the tension measurements have appreciable peaks at 2.29 and 2.84 Hz. A similar frequency multiplication has been found through hydrodynamic modeling, and these results suggest that a significant increase in power generation could be observed and defined, since the power output is proportional to the square of $d\sigma/dt$.

MI&T also performed a hydrodynamic analysis of the MWEH system. MI&T used OrcaFlex, an industry-standard tool for static and dynamic analysis of a wide range of offshore systems, for this task. OrcaFlex is a fully 3D non-linear time domain finite element program that is capable of dealing with arbitrarily large deflections. OrcaFlex provides fast and accurate analysis of catenary systems such as flexible risers and umbilical cables under wave and current loads and externally imposed motions. Wave profiles used in the OrcaFlex modeling were determined using the Joint North Sea Wave Project (JONSWAP) wave spectrum model, and were based on actual wave conditions off the coast of Oregon. FIG. 2-13 illustrates one embodiment of a spar buoy, tethers, and PTO modules (located serially within the tether lengths) modeled in OrcaFlex.

The buoy was modeled as a series of co-axial cylinders mounted end to end along the local z-axis as shown in FIG. 2-13. This allowed execution of the model with changes to the buoy geometry, by specifying the number of cylinders and their lengths and diameters. Heave stiffness and righting moments in pitch and roll were determined by calculating the intersection of the water surface with each of the cylinders making up the buoy, allowing for the instantaneous position and attitude of the buoy in the wave. Hydrodynamic loads on the buoy were calculated using Morison's equation and added mass and damping were calculated by WAMIT, a computer program based on the linear and second-order potential theory for analyzing floating or submerged bodies. Drag forces in the model were applied only to submerged parts of the buoy. Added mass and drag were proportioned based on the submerged fraction of the buoy. Each of the tethers was modeled as a "Line" in OrcaFlex as shown in FIG. 2-13. In OrcaFlex, lines are flexible linear elements used to model cables, hoses, chains or other similar items, and are represented using a lumped mass model.

The main results of the dynamic modeling activities were:
1. Buoy "draft"—the length of buoy under water—is a key factor that determines the nature of buoy motion and tether loading in the system. For the Oregon wave spectra used, a buoy draft of 6 m provided stability of the buoy across all the wave conditions experienced. Instability in the tether was never seen except in a simulation of a 100-year wave (which may be addressed through system design optimization).
2. With a 6-meter draft with nine tethers, there was a very strong correlation ($R^2$=0.89-1.00) between top line tensions on the five tethers on the same side of the buoy relative to the wave direction, and a comparatively weaker, but positive, correlation between tethers on opposite sides relative to the wave direction (0.3-0.7). In the sample data shown in FIG. 2-14a, the line tensions of nine tethers connected to a buoy with a 6 m draft, in a wave condition with significant wave height of 5.2 m and average period of 5.2 seconds is presented.
3. With a 6-meter buoy draft, there was a very high correlation coefficient ($R^2$=1.00) between top line tensions and bottom line tensions on each tether as shown in FIG. 2-14b. The magnitude of the tensions at the top and bottom of each tether was offset slightly due to the weight of the PTOs and chains on the tether itself
4. For a given buoy, the stress scaled fairly predictably with the number of tethers. Analysis of a 6 m draft buoy with 9 and 6 tethers, respectively, was performed, and as expected the line tensions increased. There was good correlation between the tensions in each case, but the average line tension was about 10% higher than the expected factor of 1.5, presumably due to the greater range of motions possible for the buoy due to the reduced tether stiffness (this load increase may be beneficial from a power production stand-point).

The results of the hydrodynamic modeling were incorporated into a cost model to determine the levelized cost of energy (LCOE); previous LCOE projections were based on sinusoidal waveforms.

A detailed cost model for the MWEH is built upon the validated performance model described above, and utilizing cost methodologies developed by NREL for the evaluation of new technologies for the wind industry. A summary of the cost model is shown in FIGS. 2-15a and 2-15b. In addition to the alloy material itself, all of the other associated components (e.g., copper coils, mooring chain link, buoys, anchors, power-electronics, sealing systems, engineering, installation, maintenance, permits, depreciation) are considered, and a general principle of conservatism was employed across the board. Significant project uncertainty (10% of capital costs) was also built in for conservatism. This model incorporates the results of hydrodynamic modeling into the cost model. The results show that the technology should be quite attractive for utility scale power production and can deliver levelized costs of energy of $0.10-0.20/kWh for initial deployments and under $0.10/kWh for larger farms.

While the corrosion testing has indicated that the low cost magnetostrictive alloys studied are susceptible to surface corrosion, design and testing of prototype units has significantly reduced the impact of this finding on overall product success. After a full day of submersion in a proprietary lab and two days of submersion in the Berkeley wave tank under load, the low cost commercial compression seals used on the prototype units held up very well. The use of these extremely reliable seals (PTFE gaskets between flanges and compression fittings) is unique to embodiments of the device described herein due to the ability to make electric power without significant relative motion. The ability to use these sealing techniques, well proven in the marine environment, provides confidence that the Fe—Al alloys can be used, despite their surface corrosion characteristics, without compromising product lifetime. However, some embodiments may include redundancy in corrosion protection for longer periods of testing under more aggressive conditions.

Alloys 13, 14 and 15 listed in the table shown in FIG. 2-5 have no magneto-mechanical or electrical properties reported because the parts broke during machining It was a concern that certain compositions could not survive machining While an increase in the percentage of Al in Fe—Al alloys has been shown to make the alloy more brittle, it is not clear that the failures were driven by that factor alone. It is possible that this is due to a problem in the processing of the rods as the more recent alloys have been centerless-ground to the desired outer diameter, whereas the earlier rods were turned on a lathe. To determine if the particular machining operation was indeed the problem, one rod each from the same cast batch of 18.5% Al was machined using each method. The rod that underwent centerless grinding fractured, but the rod that was lathed did not and could be tested. While centerless grinding may not be the sole cause of all the failures, it does appear responsible for many of the failed parts. Further, the failures in centerless grinding are likely a result of pre-existing flaws, which may be at least partially addressed by changes to the manufacturing process.

While some problems were identified during the course of the testing (e.g., surface corrosion characteristics of iron aluminum alloys, brittle fracture during machining of some Fe—Al alloys), work-around solutions for each of these have been identified as indicated below.

The testing has demonstrated the unique potential of the MWEH to generate power from ocean waves by de-risking key technology elements. In particular, the alloys tested in this project have shown a significant increase (>40%) in magneto-mechanical performance over those used previously and as such have been shown through detailed cost modeling to be able to provide electricity costs under $0.10/kWh in large wave farms. While the alloys do show lower corrosion resistance than stainless steel, it is relatively simple to design an enclosure that will transfer load to the magnetostrictive element while also sealing very effectively against the ocean environment, because embodiments of the design have no moving parts. The following can also result in improved performance and/or lower cost of the PTO and MWEH system.

1. Designing the PTO module with significant redundancy so that the corrosion risk factor can be effectively eliminated, while maintaining the cost advantage and not compromising performance (e.g. PVC or polyurethane spray coatings on the alloys).
2. Evaluating manufacturing process improvements (e g minimizing temperature variations to reduce grain size) and minor compositional improvements (e.g. trace alloying additions to reduce grain size) to increase reliability of the alloy rods, while not compromising performance.
3. Designing, building and testing the reliability and performance of a significantly scaled up PTO module lab conditions that simulate and exceed specific expected operating environments in the ocean (e.g. high pressure leak testing, accelerated cyclic fatigue testing).
4. Enhancing the system performance through a targeted hydrodynamic modeling effort that can further reduce costs by increasing the energy transfer characteristics from the buoy to the tether (e.g. tethers may be at a slight angle to reduce buoy motion and increase tether loads).
5. Testing the optimized PTO in a wave tank environment that can produce waves of sufficient height so as to produce stresses that are similar to those experienced by the full-scale PTO in an ocean environment (e.g., open air wave tank at Ohmsett).

Using a combination of external flux paths and bias magnetic fields has a positive impact on performance of the magnetostrictive alloy. As such, optimizing the flux path configuration in terms of the number of flux paths, cross-sectional area of flux paths and bias field magnets, bias field magnet thickness, and material composition of the flux paths may have further impacts on performance of the magnetostrictive alloy. Changes in these parameters can be directly tied to changes in either the magnetic reluctance and permeability or the magneto-motive force (MMF) of the magnetic circuit. Each configuration was evaluated based on the change in flux density per strain cycle as a function of change in load.

For each test, the bias field was applied to the magnetostrictive element using rectangular neodymium rare-earth permanent magnets. The magnetostrictive rod 202 was then compressed in the hydraulic loading system 230, as shown in FIG. 2-6. The rare-earth magnets provided the MMF, which was directed through the magnetostrictive rod by flux paths 216 composed of mild steel (1018) that formed a closed magnetic circuit. The circuit was magnetically isolated from the steel frame of the hydraulic press 230 by large aluminum spacers. The compressive load was quickly released, and the change in magnetic flux induced a voltage in a copper-wire coil 210 around the magnetostrictive element 202, which was recorded with a data-acquisition system. The voltage change as a function of time was then integrated to calculate the change in magnetic flux density. For all tests the magnetostrictive element 202 was a 6.25" long, 0.956" diameter Fe—Al rod.

In order to maximize the change in flux per strain cycle (ΔB), a parametric study of the configuration was performed in which the magnet geometry and the corresponding flux path geometry were varied. The magnet geometry is defined by the cross-sectional area, which is the area normal to the flux paths, and the magnet thickness, which is the dimension along the flux path. Three different cross-sectional areas were tested, with different thicknesses for each. For each of these eight magnet sizes, the configuration was altered to have 1, 2, or 3 flux paths with a single magnet on each path. These tests were performed with a binary iron-aluminum alloy with 19% atomic aluminum. FIG. 3-1 shows the three different flux path configurations for a given magnet size. In particular, image (a) of FIG. 3-2 shows a single flux path; image (b) shows two flux paths; and image (c) shows three flux paths. When the number of flux paths and bias field magnets, as well as the magnet cross-section, are held constant, an increase in the thickness of the magnets decreases the maximum flux change for a given change in load, as shown in FIG. 3-2.

This is attributed to the fact that thicker magnets have a proportionately greater MMF, and at lower applied loads, the changes in magnetic permeability of the magnetostrictive rod with stress are too small to reduce the flux density significantly below saturation. This explains the flat regions at low stresses in the FIG. 3-2 plots, and that this flat region becomes progressively more prominent at greater magnet thickness. Further, the increase in MMF, which increases linearly with magnet thickness, is countered by the increase in internal reluctance of the rare-earth magnets as their thickness increases, relative to the reluctance of the rest of the magnetic circuit. Magnetic reluctance is equal to $R=L/(\mu A)$ where R is the magnetic reluctance, L is the length dimension along the direction of the magnetic flux lines within the body (i.e. the thickness of the magnet for a rectangular magnet that is magnetized so that the poles are on the large area faces), $\mu$ is the magnetic permeability and A is the area of cross-section. The reluctance therefore scales linearly with the thickness of the magnets, and since $\mu$ for rare-earth permanent magnets is only about 1.1 times greater than that of air, the effect of increasing magnet thickness is effectively the same as adding an air gap. The increase in magnet thickness is also observed to shift the flux change curve towards higher loads, i.e., a thicker magnet will require a higher change in load to achieve the same flux change as a thinner magnet. These phenomena are not, however, observed for the single flux path consisting of 2"×0.5" cross-section magnets. For this particular configuration, an increase in magnet thickness increases the maximum flux change without any apparent shift in the curve. This is likely due to the lower flux caused by the single, relatively small magnet.

A similar shift in the curves is seen in FIG. 3-3 for an increase in magnet cross-section for a given thickness and number of flux paths. While this shift is consistent for all of the magnets tested, this shift does not necessarily correspond to a decrease in the maximum change in flux. For each of the configurations tested, the 2"×1" magnets appear to give the highest change in flux, with a maximum of 0.953 T for the two flux path configuration at 0.0625" magnet thickness.

Increasing the number of flux paths for a given magnet geometry again causes the flux change curve to shift towards higher loads and the maximum flux change to decrease for a given load, as shown in FIG. 3-4. The exception to this again occurs with the 2"×0.5" magnets. For the 0.0625" and 0.125" thicknesses, an increase in the number of flux paths causes an increase in the maximum flux change, up to a point.

It is possible increase the maximum ΔB even higher by using smaller 2"×0.5" cross-section magnets with vertical flux paths of the same cross-section and top and bottom flux paths with twice that cross-section, at 2"×1". The increase in ΔB is attributed to the increased area of the horizontal portions of the paths, which are shared for all legs of the circuit; that is, for each flux path the top and bottom pieces are shared and thus should have a larger area to pass the larger flux without saturating. With this enhancement, and using an optimized alloy composition of 18.5% Al, ΔB values over 1 T can be achieved, as shown in FIG. 3-5. The addition of a second flux path increases the maximum ΔB by 71% over that of a single flux path, but the gains for additional paths fall off rapidly thereafter: 8% increase for a third path, 2% increase for a fourth, 1% for a fifth, and 0.7% for a sixth (See FIG. 3-6). As a result, the increase in device cost and complexity begins to quickly outpace any gains in ΔB beyond 1 Tesla.

The choice of material for the flux paths has a marked effect on the performance of the device. Three different materials for the flux path with different materials characteristics are listed below, along with their impact on overall system performance.

1. Cast iron: High saturation magnetization (>2.2 T), high relative permeability (2000-5000)
2. Mild steel (1018): High saturation magnetization (>2.1 T), moderate relative permeability (200-500)
3. Duplex stainless steel (2025)—Low saturation magnetization (<1.5 T), moderate relative permeability (50-100).

Mild steel gave the most desirable performance characteristics with the greatest overall flux change as shown in FIG. 3-7. Cast iron also performed well, but not as well as the mild steel in terms of maximum ΔB observed; its curve also had a lower slope (dB/dσ), which affects the net power generation capacity of the system. Duplex stainless steel performed very poorly due to its low saturation magnetization.

In addition, improved performance was demonstrated through the use of unloaded magnetostrictive rods as flux paths. The Fe—Al alloys have a permeability that is about half that of mild steel. In some embodiments, the vertical flux path components may be replaced with one or more magnetostrictive rods while using mild steel for the top and bottom flux paths. FIG. 3-8 illustrates an embodiment of a device 300 which includes a magnetostrictive rod 302 under load within the flux path and a second magnetostrictive rod 304 that is not under load, but is used within the flux path. For this setup, there are two magnetostrictive rods 302 and 304 making up a single closed flux path, but only one rod 302 is under load. This use of one or more unloaded Fe—Al magnetostrictive elements resulted in a performance improvement of about 10% over that of mild steel alone.

The voltage that each device produces is directly proportional to the number of turns of wire through which the flux passes. In an effort to maximize the number of turns, it may be possible to have a coil around the flux path components in addition to the coil around the loaded magnetostrictive rod. As a demonstration of this concept, a coil may be placed around the unloaded Fe—Al flux path component 304 in the single flux-path configuration shown in FIG. 3-8, and a compressive load may be applied to the other magnetostrictive rod 302. The resulting open-circuit voltage for both coils can be measured to infer flux change (proportional to the area under the voltage curve, shown in FIG. 3-9). These waveforms were measured with identical 1400 turn coils. Assuming that the flux path was a closed circuit, it could be expected that they should measure the same value. This was not, however, what was observed. The change in flux measured on the flux-path rod 304 is 0.55 T, 40% less than the 0.91 T measured on the loaded magnetostrictive rod 302.

The first measurements showing this discrepancy were taken with the coils connected to a load, and the difference was originally attributed to an inductance difference. It was clear in that measurement that inductance was playing a role, as the peak of the voltage waveform from the flux-path coil measurement occurred nearly a tenth of a second later than the peak of the magnetostrictive coil voltage. The cause for the difference could be that the inductance of a coil is directly proportional to the relative permeability of the core material, and as the magnetostrictive rod is loaded, its relative permeability, and therefore the coil inductance, decreases. A less inductive coil provides less opposition to the change in current, causing its voltage to peak more quickly. While this explains the temporal shift in voltage peaks, the resulting flux change measured by each coil was the same as that of the respective open-circuit voltage measurements, where inductance would not have been an issue due to the lack of current.

To explore whether this observation was a result of the change in inductance in the loaded rod, the load was applied to both rods 302 and 304. This would cause the permeability, and therefore the inductance, to change in both rods 302 and 304 at the same time. The voltage waveforms were approximately the same, as expected (see FIG. 3-10), but the change ΔB in total flux density did not decrease, even with the lower stress. This implies that it may be possible to design the flux paths in such a way that a lower applied stress can produce the same amount of power, and thus increase device reliability without sacrificing performance. These measurements also support the notion that having coils around a larger portion of the magnetic circuit can lead to large gains in power generation.

In some embodiments, aluminum coils may be used as a substitute for copper (Cu) coils. The two main advantages for using Al for the coils are cost and weight. The density of Al is less than a third of that of Cu, and, based on commodity pricing, aluminum is one-third as expensive per ton, and therefore aluminum commodity costs per unit volume are around one-ninth of that of copper. Even after incorporating Al's 1.67 times higher resistance, it appears that use of Al coil could result in lower costs. Testing shows that this increase in internal resistance of the coil leads to a reduction in energy produced per strain cycle of 10-15% for the same load resistance. Additionally, the lighter aluminum coil would reduce the weight of the full-scale device, which would translate into savings on installation costs. Also, a cost model indicates that once increased scale drives the aluminum wire manufacturing cost multiplier (i.e., manufactured cost as a multiple of the commodity metal cost) to be closer to that of copper (1.2-1.3)), there may be a significant benefit in using Al wire in at least some embodiments.

In one embodiment, the PTO module 240 (see the sub-scale compression fixture design of FIG. 2-10) includes a compression fixture 242 to apply a bias compressive load to the magnetostrictive rod 202. This bias load will then be partially relieved when a tensile force, such as that from the wave/buoy interaction, is applied to the PTO module 240, and this change in load is what is converted into magnetic energy. The fixture also includes considerations for the flux paths 216, and in some embodiments is integrated with the flux paths 216. As such, the design criteria for at least one embodiment of the compression fixture are that the fixture maintains a bias compressive load while transferring the large majority of load changes to the magnetostrictive rod 202, and the fixture incorporates flux paths 216.

The magnetostrictive element 202 was 11" long with a 1.125" diameter. The fixture 242 was made out of mild steel and had four flux paths 216, each of which included a 2"×1"× 0.0625" NdFeB magnet 244, and had four stainless steel bolts 246 to apply and hold the bias compressive stress to the magnetostrictive element 202. The magnetostrictive element 202 had an internal thread machined into each end, into which a stainless steel eye-bolt 252 was threaded and the tensile load applied. The internal thread removed a large fraction of the mating surface between the compression fixture end-plates and the magnetostrictive rod 202, and this smaller area could lead to a flux density large enough to reach saturation. To address this concern, shoulders were machined onto the ends of the rod 202 and counter-bores were machined into the end-plates so that the magnetostrictive rod 202 would slip-fit into the end plates of the compression fixture 242, thereby increasing the contact area between them. Careful consideration was given to the fixture design to maintain the integrity of the magnetic circuit; the compression bolts 246 were made from very low permeability stainless steel, and the magnets 244 were held in place with small aluminum brackets (not shown), which were bolted to the flux paths with nylon bolts (not shown), all to avoid any potential shorts in the magnetic circuit. The compressive stress applied to the magnetostrictive rod 202 was calibrated against bolt torque, which allowed flexibility to change the applied stress to the desired value by simply tightening or loosening the bolts 246. For at least some of the tests, the device is configured to operate in a region with maximum dB/dσ, which corresponded to a bias load of 5,000 lbs.

Bench testing of the compression fixture was performed by applying a cyclic tensile load to the device while measuring both the applied load and the open-circuit output voltage. The force was applied by hand using a lever arm that achieved load changes on the order of 300 pounds. In other embodiments, a load that is more than an order of magnitude higher than this may be applied using an electro-hydraulic press. The application of the relatively smaller load by hand allowed a loading pattern that is more consistent with the load changes that would be experienced in the ocean environment, albeit at a much lower amplitude. FIG. 3-11 depicts an image of one embodiment of the sub-scale compression fixture design of FIG. 2-10.

FIG. 3-12 illustrates a graph of results of bench testing of the compression fixture of FIG. 3-11. The measured load and voltage were low-pass filtered at 55 Hz to remove the noise associated with line voltage. The predicted voltage was calculated using Faraday's law of induction, $$V=NA(dB/d\sigma)(d\sigma/dt),$$

where N is the number of turns of the coil, A is the cross-sectional area of the rod, and a is the applied load. The value of dB/dσ was found by minimizing the standard deviation of the difference between the actual and calculated voltages. The predicted voltage closely matches the measured output, with an R-squared of 0.88. The magnitude of dB/dσ is roughly one third of the value arrived at through magneto-mechanical performance testing. This is due to load sharing between the magnetostrictive rod 202 and the bolts 246 in the compression fixture 242. Test results confirmed predictions that only 30% of the applied load would be felt by the magnetostrictive rod 202.

Analysis shows that careful design of the compression fixture 242 can result in load transfers to the magnetostrictive rod 202 of over 90%. This can be achieved by decreasing the effective stiffness of the bolts 246 relative to that of the magnetostrictive alloy 202, either by using a material 202 with a lower Young's modulus or by decreasing the combined cross-sectional area of the bolts 246. As an example, if we were to use two 0.375" bolts 246 with a Young's modulus (E)

of 100 GPa to apply a 100 MPa strain to a 1" diameter Fe—Al rod (E =160 GPa), then 89.5% of an applied tensile load would be transferred to the magnetostrictive rod 202. For an application such as this, the choice of bolt material may be very important. Titanium alloys seem to be the best candidates owing to their low tensile modulus and high yield strength, but this must be balanced against the substantially higher cost for these components. Brass and bronze may offer good solutions as relatively low cost options that can still achieve over 85% load transfer to the magnetostrictive alloy rods 202.

FIG. 3-13 illustrates a schematic circuit diagram to show how the magnets, flux path components and magnetic components are treated in the magnetic circuit. This circuit diagram may be used to model the behavior of the MWEH PTO. Magnetic circuit analysis is analogous to electrical circuit analysis—the magnetic flux is similar to current, the MMF is similar to voltage and the reluctance is similar to resistance. The flux paths are assumed to be closed with no leakage reluctances in this analysis. The MMF of the rare-earth magnets was calculated from the geometry (thickness) and the coercivity of the material. The first step was to estimate the change in permeability of the alloy rods as a function of stress. This was done by measuring the flux change data and using a simple one flux path circuit to assess permeability. A sample calculation based on one set of measured data is shown in FIG. 3-14. This data was fitted to a third-order polynomial, which we then used to predict the changes in permeability with stress for more complex configurations.

In order to model more complex configurations, this permeability analysis can be used to solve for flux in the magnetostrictive rod knowing all the other circuit parameters on a spreadsheet-based model. The model was very successful in predicting general trends in the data despite its simplicity. For example, FIG. 3-15 shows the predicted flux in one and two flux path configurations for 2"×0.5"×0.0625" magnets, and FIG. 3-16 shows the shows the predicted flux in one and two flux path configuration for 2"×1"×0.0625" magnets. Both the trends in the data and shapes of the curves are very similar to the observed results. The slight changes in actual flux density measured are likely due to the fact that the simple model assumes that the saturation magnetization is achieved at a fixed stress level, while in reality this is likely approached asymptotically. Also, the model does not consider the variations of permeability as a function of the internal flux—only as a function of stress. However, considering this, the power of this simple model to predict performance fairly closely to the measured results is very encouraging and should be a powerful tool for us going forward.

The foregoing demonstrates a 1 T change in magnetic flux density per strain cycle and a component fabrication process that will allow for high-throughput manufacturing.

FIG. 4-1 shows an embodiment of a device 400 with a moving mass 402 and springs 404 that may be used for harvesting energy from vibrations of machinery 406, such as drills. The device 400 may be incorporated into the machinery 406 or coupled mechanically otherwise to vibrate with at least one component in the machinery 406. In a drilling application, the device 400 may be part of the drill string or incorporated within or outside a drill collar. In some embodiments, the device 400 may be used for harvesting energy from the lateral vibrations of a drill string or drill collar. As the drill string or drill collar vibrates, one or more moving masses 402 may move in phase with or out of phase (or in an unsynchronized manner) with the vibrating part and/or result in extension of compression of one or more springs 404 which transfer a load to a magnetostrictive element 402. The element 402 may have other associated components such as a flux path, pre-compression fixture, magnets etc, arranged in a configuration such that the changes in stress experienced by the element may be converted into changes in magnetic flux through the element, and electric current/voltage being produced in one or more coils that may be around or near the element or flux paths. Many such devices may be arranged in a variety of ways, including along the circumference or length of the drill or vibrating machinery 406.

FIG. 4-2 shows an embodiment of a device 410 with one or more magnetostrictive elements 402 that may be used for harvesting energy from vibrations of machinery 406, such as drills. The device 400 may be incorporated into the machinery 406 or coupled mechanically otherwise to vibrate with at least one component in the machinery 406. In a drilling application, the device 400 may be part of the drill string or incorporated within or outside a drill collar. In some embodiments, the device 400 may be used for harvesting energy from the bending of a drill string or drill collar as it vibrates. As the drill string or drill collar vibrates in a lateral mode, it may bend, one or more magnetostrictive elements 402 extending or contracting in phase with or out of phase (or in an unsynchronized manner) with the vibrating part. The element or elements 402 may have other associated components such as a flux path, pre-compression fixture, magnets etc, arranged in a configuration such that the changes in stress experienced by the element may be converted into changes in magnetic flux through the element, and electric current/voltage being produced in one or more coils that may be around or near the element or flux paths. Many such devices 400 may be arranged in a variety of ways, including along the circumference or length of the drill or vibrating machinery 406.

In a similar manner to the embodiments shown in FIGS. 4-1 and 4-2, embodiments of the devices 400 and 410 may be coupled to any elongated structure of a piece of machinery that experiences vibrational movement. In some embodiments, the elongated structure is a component of a drill string or bottom hole assembly of a drilling rig. However, in other embodiments and applications, the elongated structure may be a different type of components of a drilling rig or other machinery.

What is claimed is:

1. An apparatus for harvesting electrical power from mechanical energy, the apparatus comprising:
   a first a load-bearing structure;
   a second load-bearing structure, wherein the first and second load-bearing structures are configured to experience a force from an external source;
   a plurality of magnetostrictive elements arranged between the first and second load-bearing structures, wherein at least one of the plurality of magnetostrictive elements is configured to experience the force transferred from the first and second load-bearing structures and to experience a change in magnetic flux in response to the force; and
   an electrical circuit or coil disposed within a vicinity of the at least one magnetostrictive element configured to experience the force, wherein the electrical circuit or coil is configured to generate electric power in response to the change in the magnetic flux of the at least one magnetostrictive element.

2. The apparatus of claim 1, wherein the first and second load-bearing structures and at least two of the plurality of magnetostrictive elements form at least one substantially closed magnetic loop.

3. The apparatus of claim 2, further comprising at least one permanent magnet coupled to the first load-bearing structure, wherein the at least one permanent magnet forms a part of the closed magnetic loop.

4. The apparatus of claim 1, wherein the plurality of magnetostrictive elements comprises:
   a first magnetostrictive element, wherein the first magnetostrictive element is a first load-bearing magnetostrictive element to experience at least a portion of the force transferred from the first and second load-bearing structures; and
   a second magnetostrictive element.

5. The apparatus of claim 4, wherein the second magnetostrictive element is a non-load-bearing magnetostrictive element.

6. The apparatus of claim 5, wherein:
   the first magnetostrictive element is approximately aligned between the first and second load-bearing structures in a path of the force; and
   the second magnetostrictive element is approximately out of alignment with the path of the force.

7. The apparatus of claim 4, wherein the second magnetostrictive element is a second load-bearing magnetostrictive element to experience at least a portion of the force transferred from the first and second load-bearing structures.

8. The apparatus of claim 7, wherein the electrical circuit or coil further comprises:
   a first electrical circuit or coil disposed within a vicinity of the first magnetostrictive element to generate electric power in response to the change in the magnetic flux of the first magnetostrictive element; and
   a second electrical circuit or coil disposed within a vicinity of the second magnetostrictive element to generate electric power in response to the change in the magnetic flux of the second magnetostrictive element.

9. The apparatus of claim 1, wherein the first and second load-bearing structures are configured to experience a tensile force which tends to pull the first and second load-bearing structures away from each other.

10. The apparatus of claim 1, wherein the first and second load-bearing structures are configured to experience a compressive force which tends to push the first and second load-bearing structures toward each other.

11. The apparatus of claim 1, wherein at least one of the magnetostrictive elements are substantially pre-compressed such that during their time of operation in any application, they are always substantially in compression.

12. The apparatus in claim 1, where the apparatus is incorporated as part of a system to convert the energy of ocean waves to electrical energy.

13. The apparatus in claim 1, where the apparatus is incorporated as part of a system to convert the mechanical or vibration energy of at least one component in a drilling rig to electrical energy.

14. An apparatus for harvesting electrical power from mechanical energy, the apparatus comprising:
   an attachment structure configured to attach the apparatus to a wall of an elongated structure that experiences vibrations;
   a magnetostrictive element coupled to the attachment structure, wherein the magnetostrictive element is configured to experience a force in response to the vibrations experienced by the elongated structure, wherein the magnetostrictive element is further configured to experience a change in magnetic flux in response to the force; and
   an electrical circuit or coil disposed within a vicinity of the magnetostrictive element, wherein the electrical circuit or coil is configured to generate electric power in response to the change in the magnetic flux in the magnetostrictive element.

15. The apparatus of claim 14, wherein the magnetostrictive element is approximately parallel to a length of the elongated structure.

16. The apparatus of claim 14, wherein the attachment structure comprises:
   a first attachment structure to attach a first end of the magnetostrictive element to the elongated structure; and
   a second attachment structure to attach a second end of the magnetostrictive element to the elongated structure.

17. The apparatus of claim 16, wherein the first and second attachment structures are coupled to the pipe to approximately align the magnetostrictive element with a longitudinal dimension of the elongated structure.

18. The apparatus of claim 16, wherein the first and second attachment structures are coupled to the pipe to approximately align the magnetostrictive element orthogonally relative to a longitudinal dimension of the elongated structure.

19. The apparatus of claim 14, wherein the magnetostrictive element is configured to experience the change in the magnetic flux in response to a bending deflection and/or a torsional deflection of the elongated structure.

20. The apparatus of claim 14, wherein the elongated structure is a component of a drill string or bottom hole assembly of a drilling rig.

* * * * *